United States Patent
Lee et al.

(10) Patent No.: US 11,114,375 B2
(45) Date of Patent: Sep. 7, 2021

(54) 3D STACKED MEMORY AND VERTICAL INTERCONNECT STRUCTURES FOR 3D STACKED MEMORY

(71) Applicant: Seoul National University R&DB FOUNDATION, Seoul (KR)

(72) Inventors: Jong-Ho Lee, Seoul (KR); Soochang Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 2 days.

(21) Appl. No.: 16/748,028

(22) Filed: Jan. 21, 2020

(65) Prior Publication Data

US 2020/0235050 A1    Jul. 23, 2020

Related U.S. Application Data

(60) Provisional application No. 62/795,212, filed on Jan. 22, 2019.

(51) Int. Cl.
*H01L 23/522* (2006.01)
*H01L 27/11556* (2017.01)
(Continued)

(52) U.S. Cl.
CPC ....... *H01L 23/5226* (2013.01); *G06N 3/0635* (2013.01); *H01L 23/5283* (2013.01);
(Continued)

(58) Field of Classification Search
None
See application file for complete search history.

(56) References Cited

U.S. PATENT DOCUMENTS 9,589,839 B1 * 3/2017 Ikawa ............... H01L 27/11582
10,141,326 B1   11/2018 Oh et al.

FOREIGN PATENT DOCUMENTS

| KR | 20170128996 | 11/2017 |
| KR | 20180095499 | 8/2018 |
| KR | 20190026418 | 3/2019 |

OTHER PUBLICATIONS

Choi, et al., Device Considerations for High Density and Highly Reliable 3D NAND Flash Cell in Near Future, IEEE, 2012, pp. 211-214.

(Continued)

*Primary Examiner* — Hsien Ming Lee
(74) *Attorney, Agent, or Firm* — Cantor Colburn LLP

(57) ABSTRACT

Provided is a 3D stacked memory device having a cell region in which memory stacks are arranged on a substrate. Vertical memory stacks and a vertical interconnect structure are provided in the cell region. The vertical interconnect structure includes: a via-hole formed along a vertical direction of the cell region; and a conductive pillar shaped by filling the via-hole with a conductive material. The vertical interconnect structure is configured to interconnect a top electrode of the vertical memory stack and a conductive region of the substrate along the vertical direction. The 3D stacked memory device has a vertical interconnect structure configured with a vertical wiring plug of a conductive material in a cell region, so that it is possible to facilitate the manufacturing process and providing a vertical interconnect between top and bottom electrodes of the stacked memory device or a peripheral circuit of the substrate.

15 Claims, 17 Drawing Sheets

(51) Int. Cl.
    *H01L 27/11565*  (2017.01)
    *H01L 27/1157*   (2017.01)
    *G06N 3/063*     (2006.01)
    *H01L 27/11582*  (2017.01)
    *H01L 23/528*    (2006.01)
    *H01L 23/532*    (2006.01)
    *H01L 27/11573*  (2017.01)

(52) U.S. Cl.
    CPC .... *H01L 23/53209* (2013.01); *H01L 27/1157* (2013.01); *H01L 27/11556* (2013.01); *H01L 27/11565* (2013.01); *H01L 27/11573* (2013.01); *H01L 27/11582* (2013.01)

(56) References Cited

OTHER PUBLICATIONS

Jang, et al., Vertical Cell Array using TCAT(Terabit Cell Array Transistor) Technology for Ultra High Density NAND Flash Memory, Symposium on VLSI Technology Digest of Technical Papers, 2009, pp. 192-193.
Katsumata, et al., Pipe-Shaped BiCS Flash Memory with 16 Stacked Layers and Multi-Level-Cell Operation for Ultra High Density Storage Devices, Symposium on VLSI Technology Digest of Technical Papers, 2009, pp. 136-137.
Tanaka, et al., Bit Cost Scalable Technology with Punch and Plug Process for Ultra High Density Flash Memory, Symposium on VLSI Technology Digest of Technical Papers, 2007, pp. 14-15.
Korean Office Action—Korean Application No. 10-2020-0007497 dated Jan. 23, 2021, citing KR 10-2017-0128996 and KR 10-2018-0095499.

\* cited by examiner

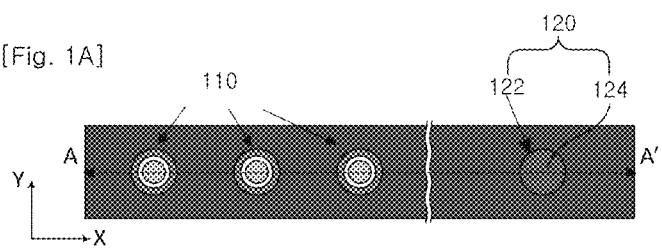
[Fig. 1A]
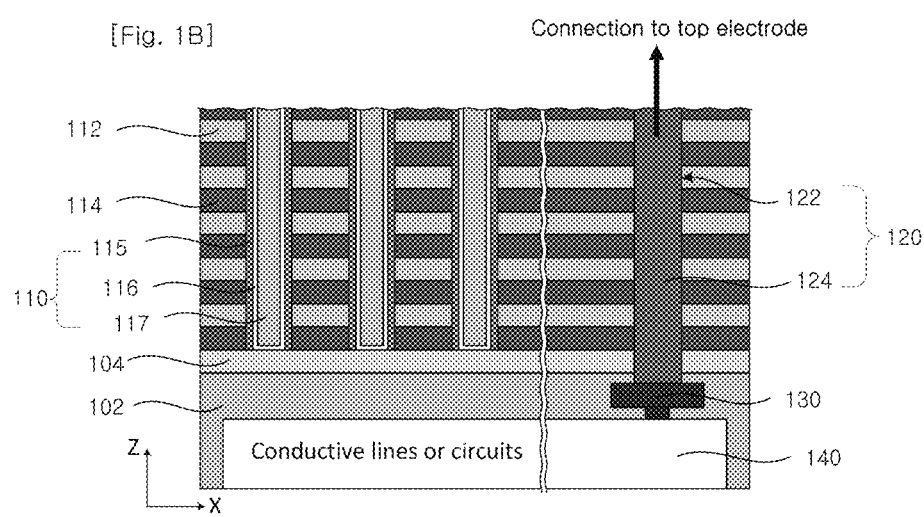
[Fig. 1B]
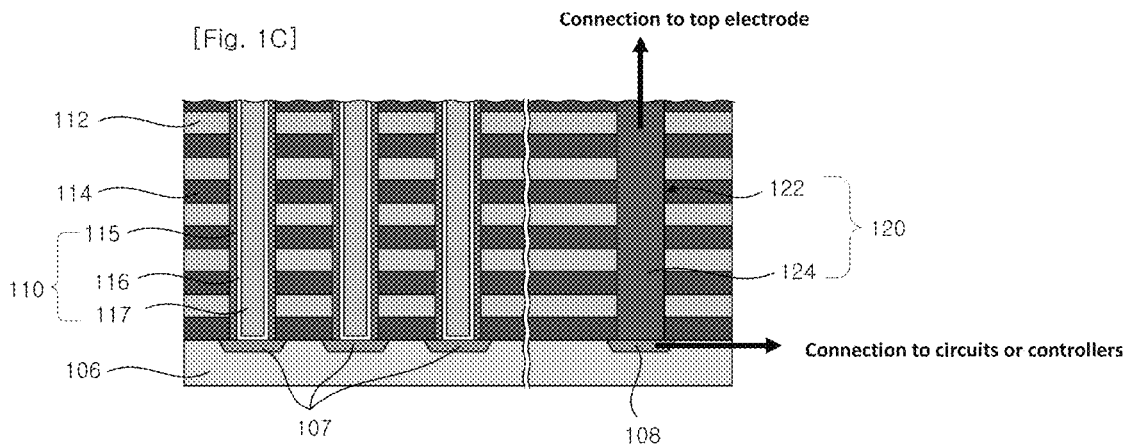
[Fig. 1C]

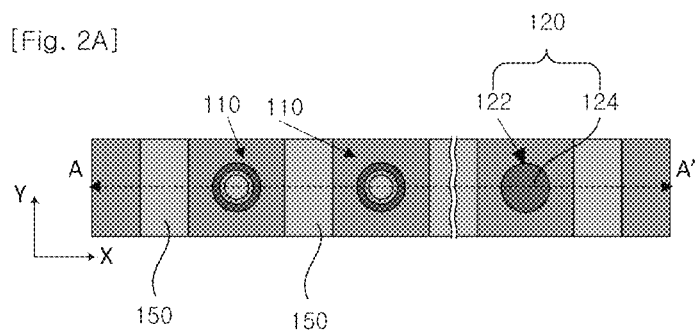
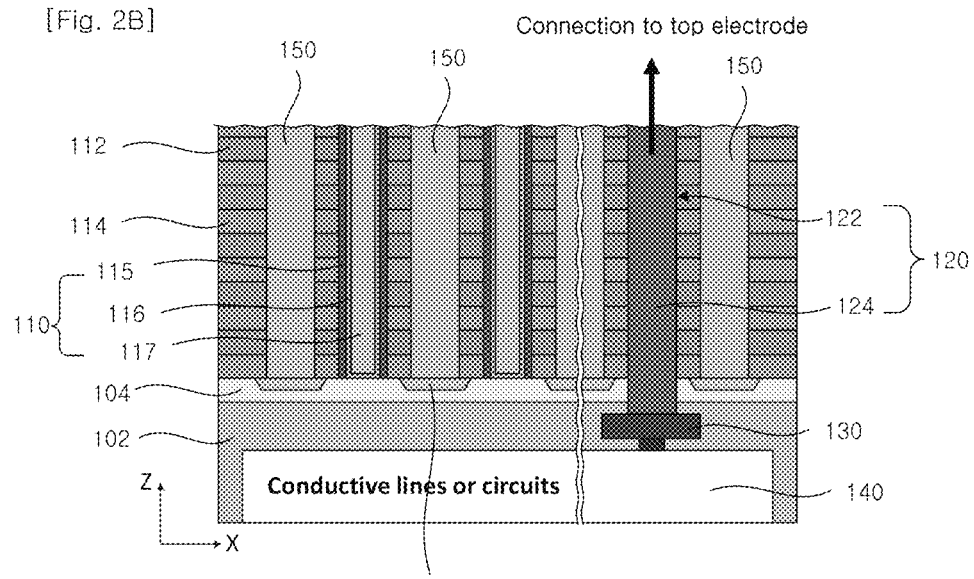
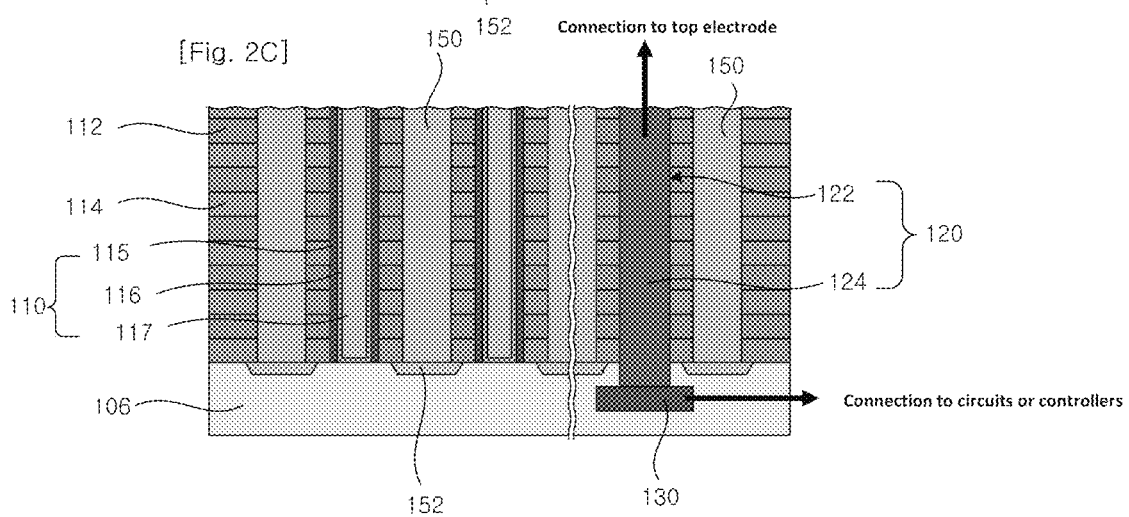

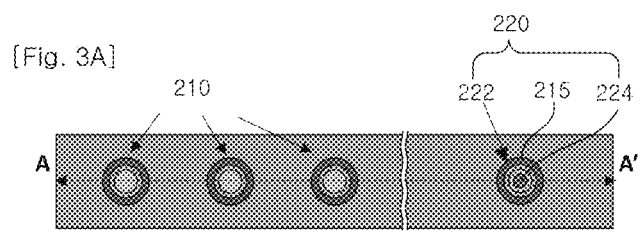
[Fig. 3A]
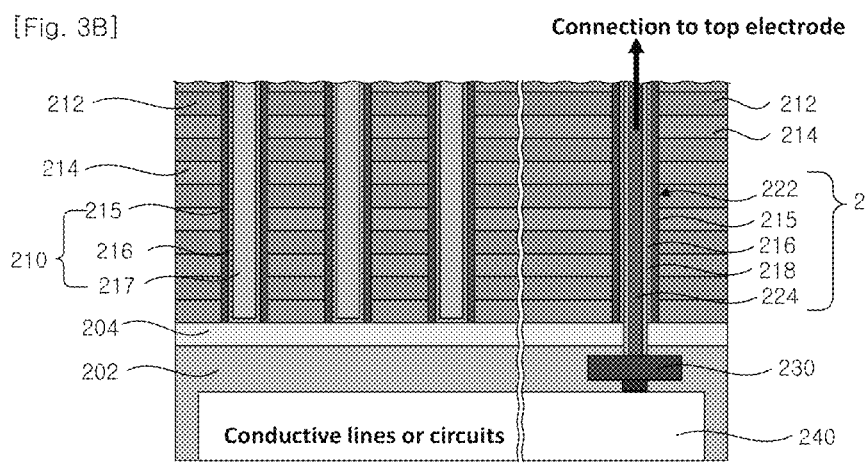
[Fig. 3B]
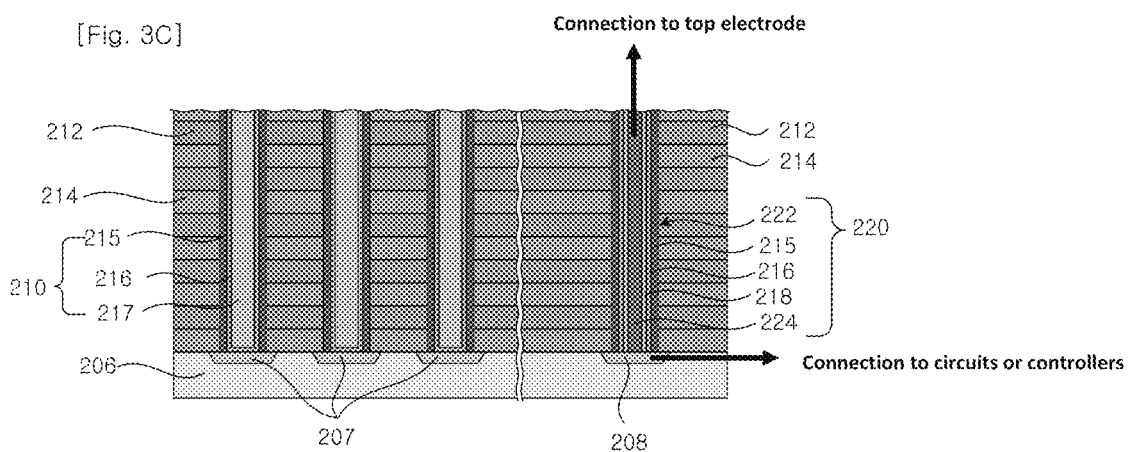
[Fig. 3C]

[Fig. 4]
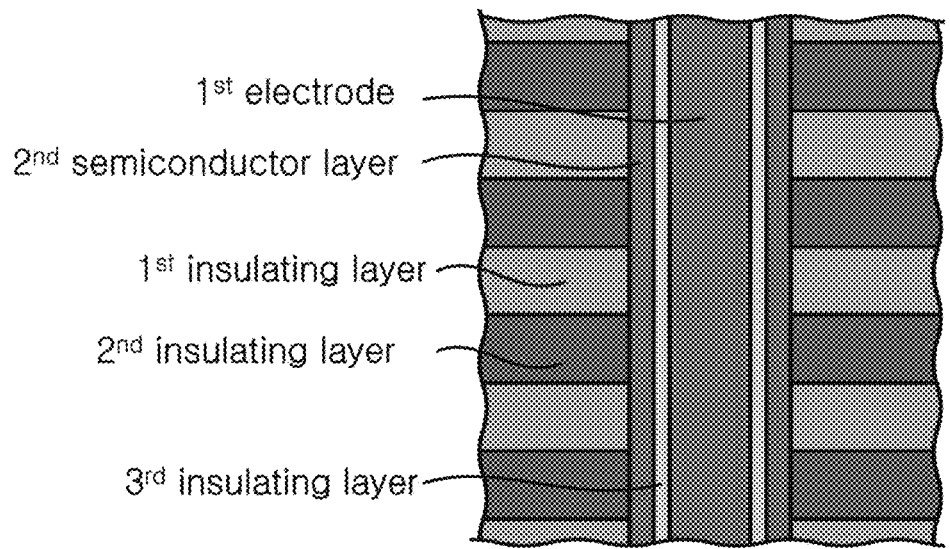
[Fig. 5]
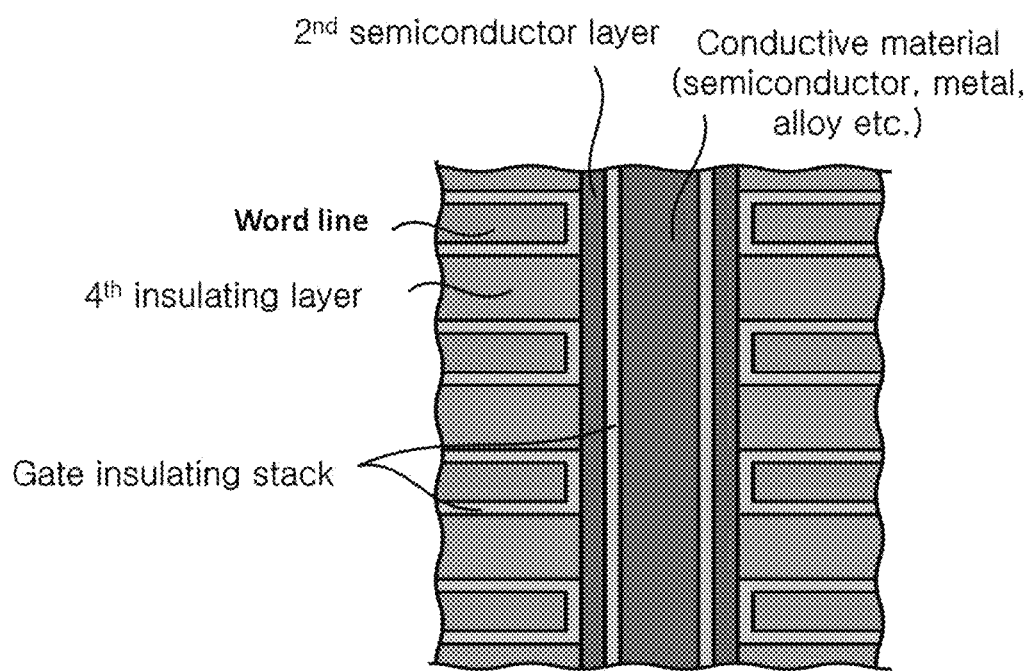

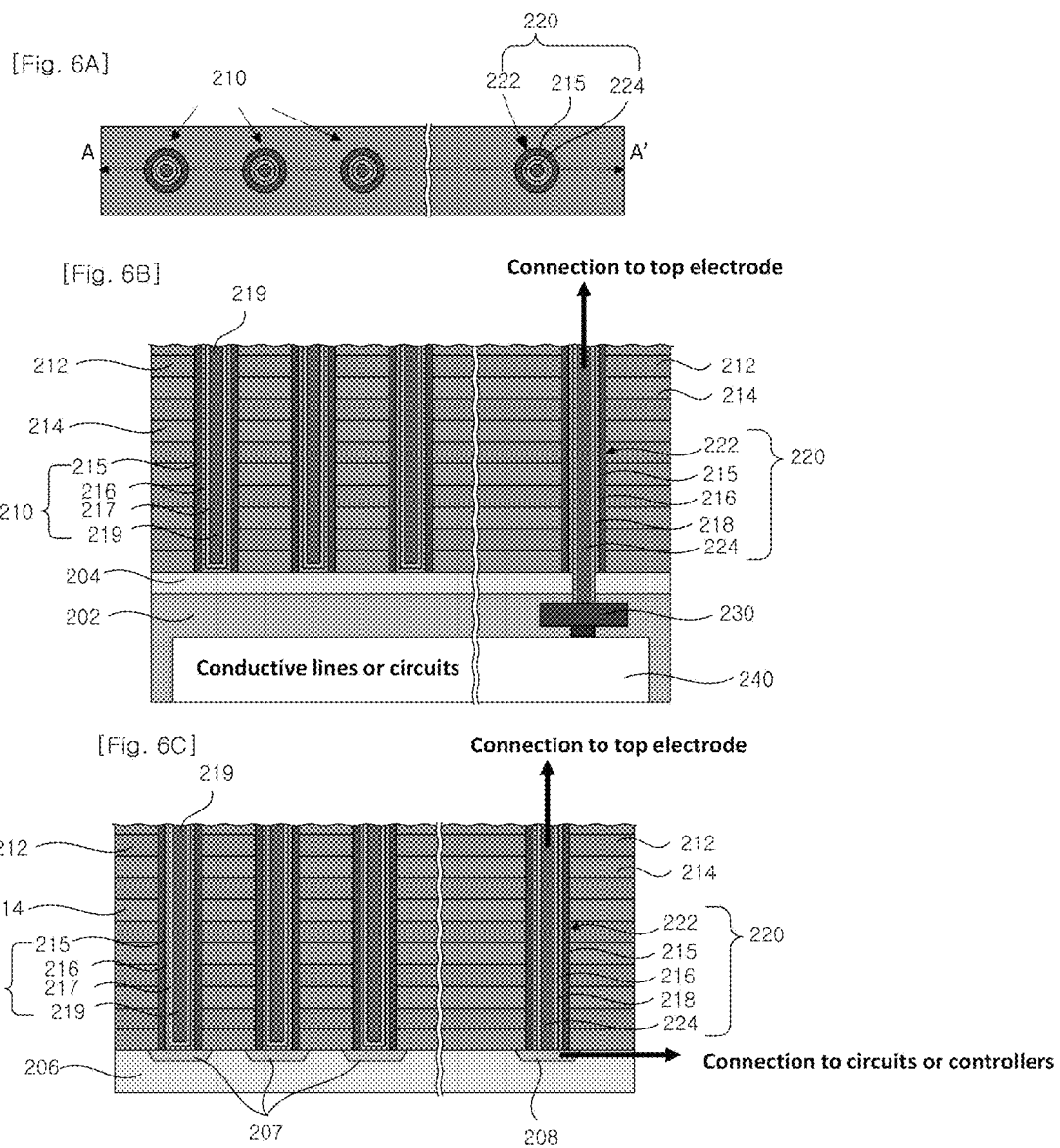

[Fig. 7A]
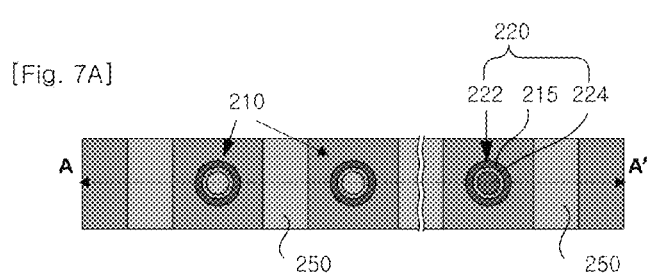
[Fig. 7B]
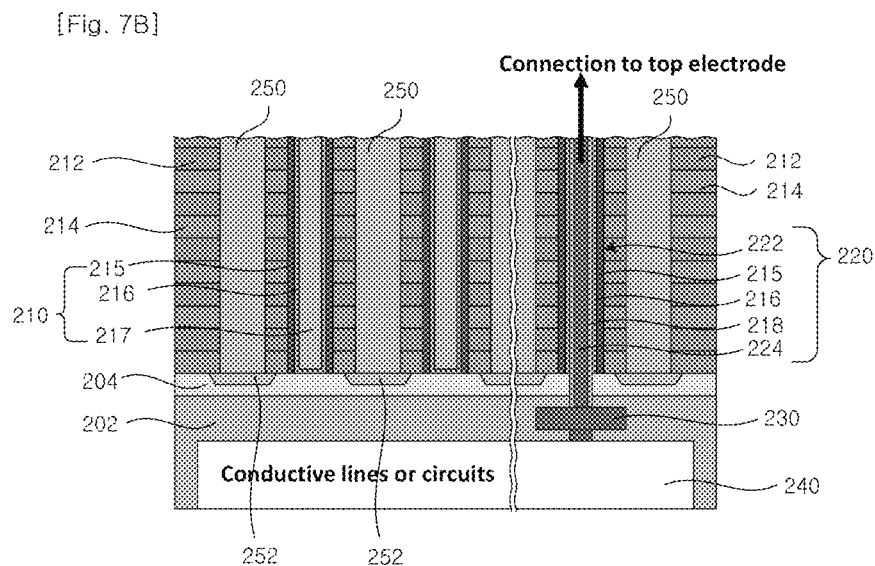
[Fig. 7C]
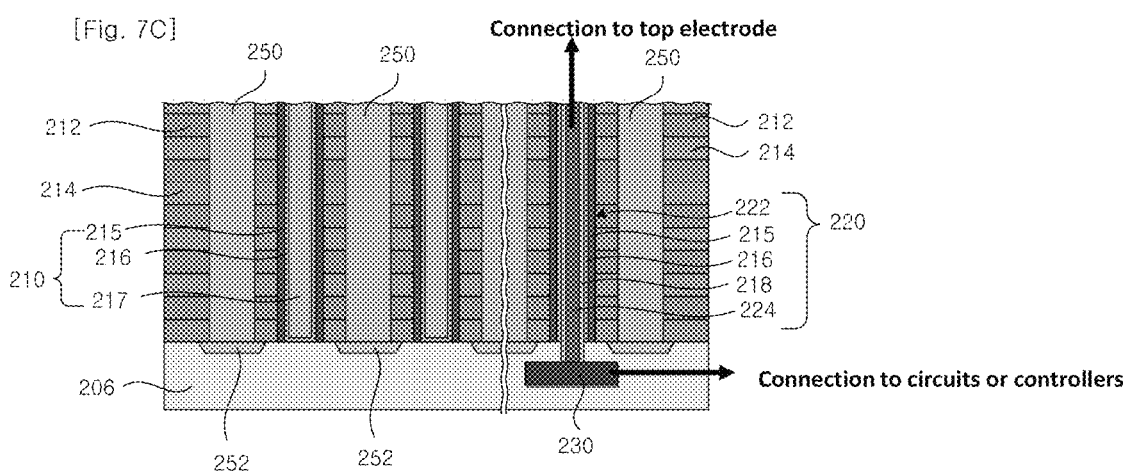

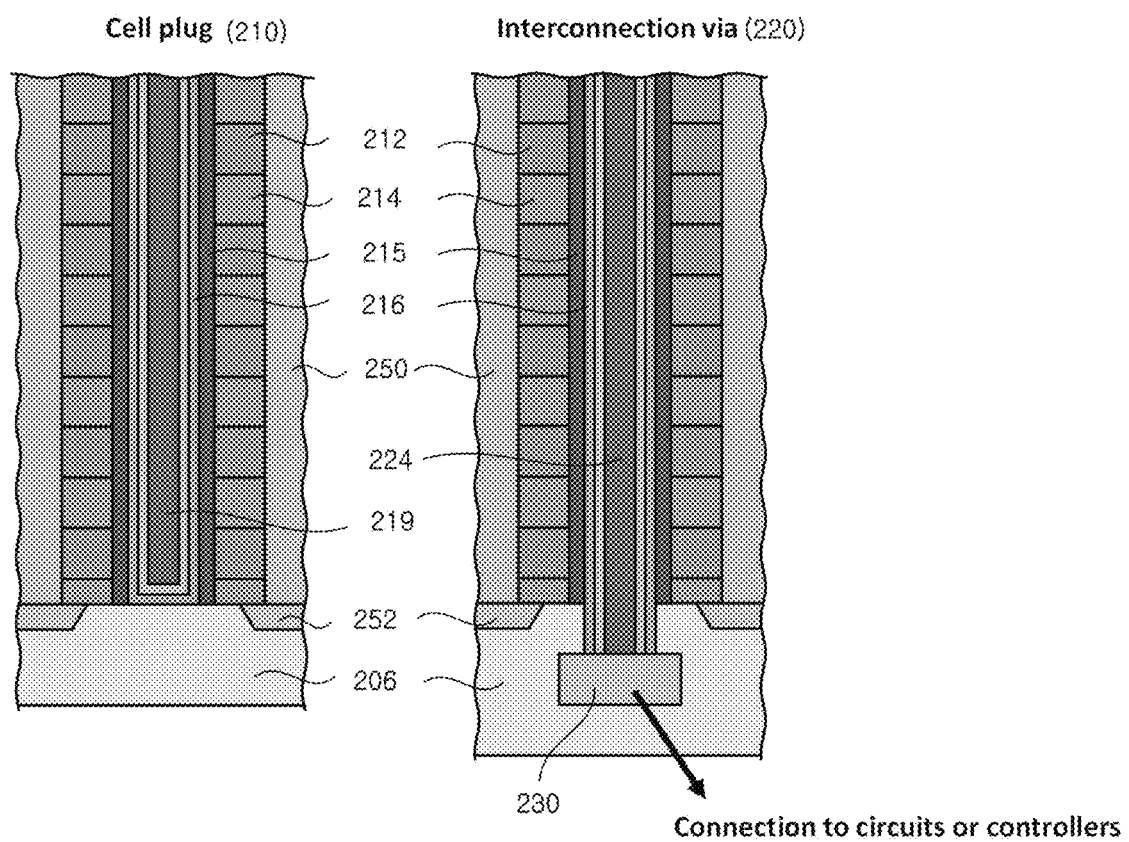
[Fig. 8]

[Fig. 9A]
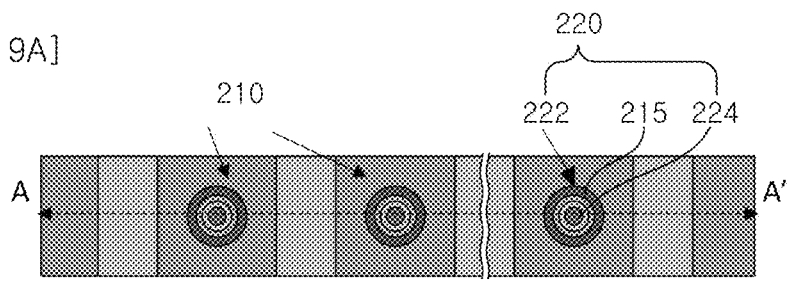
[Fig. 9B]
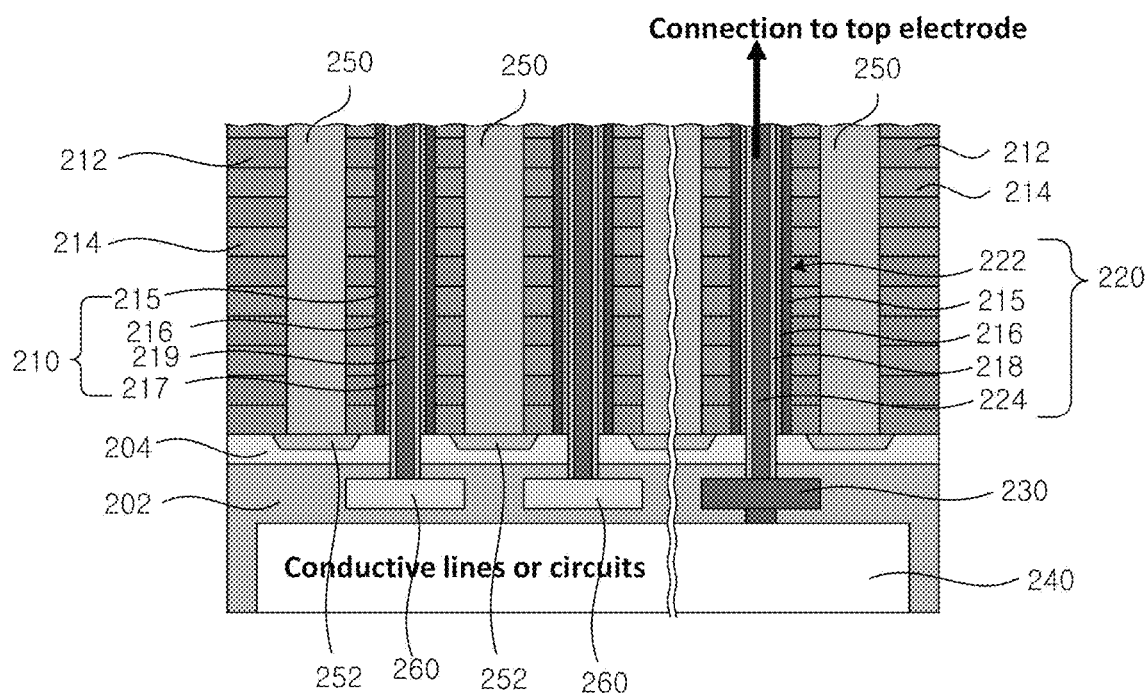

[Fig. 10]
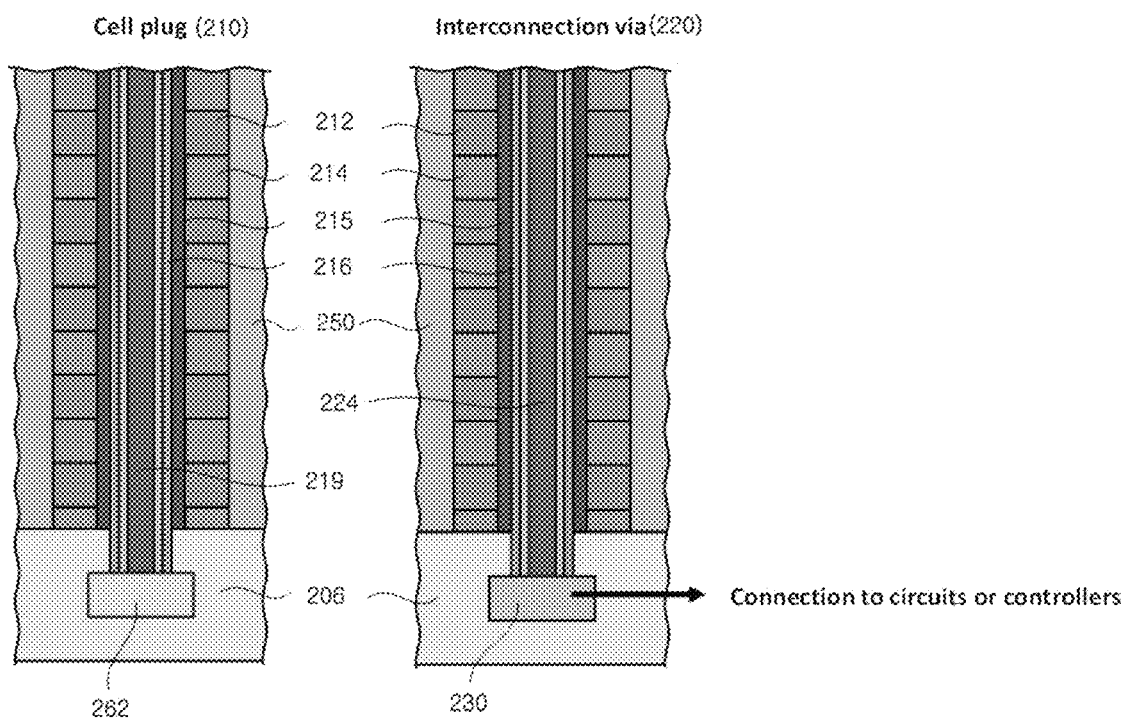
[Fig. 11]
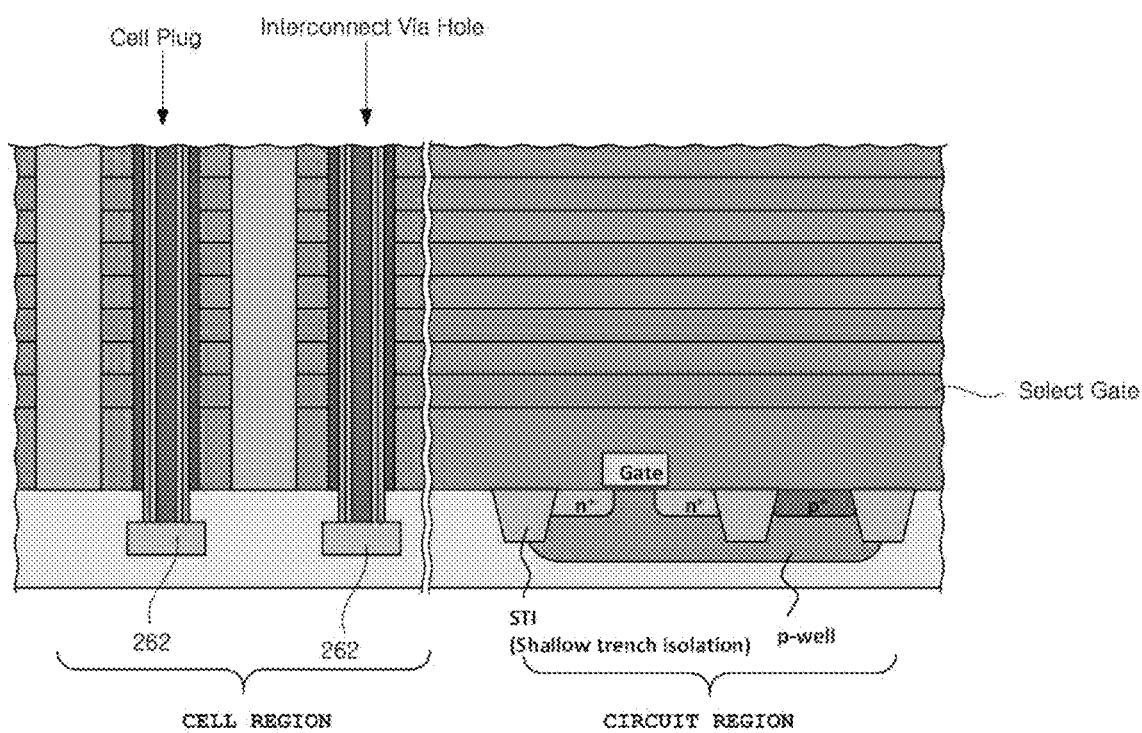

[Fig. 12A]
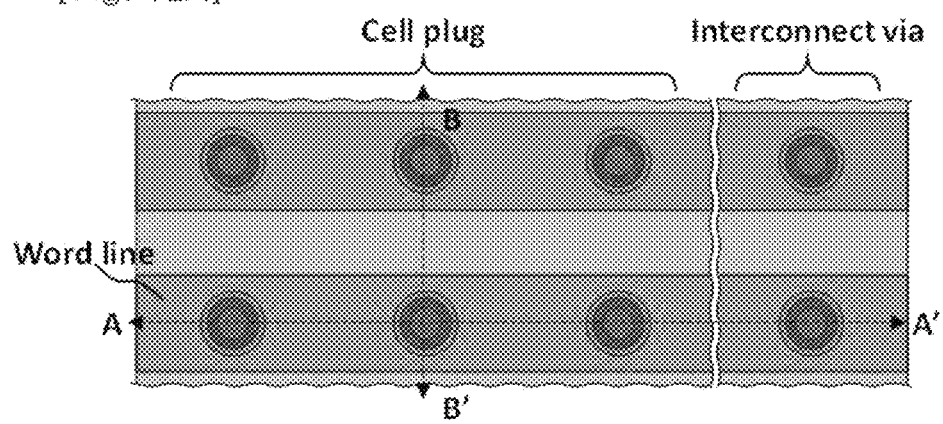
[Fig. 12B]
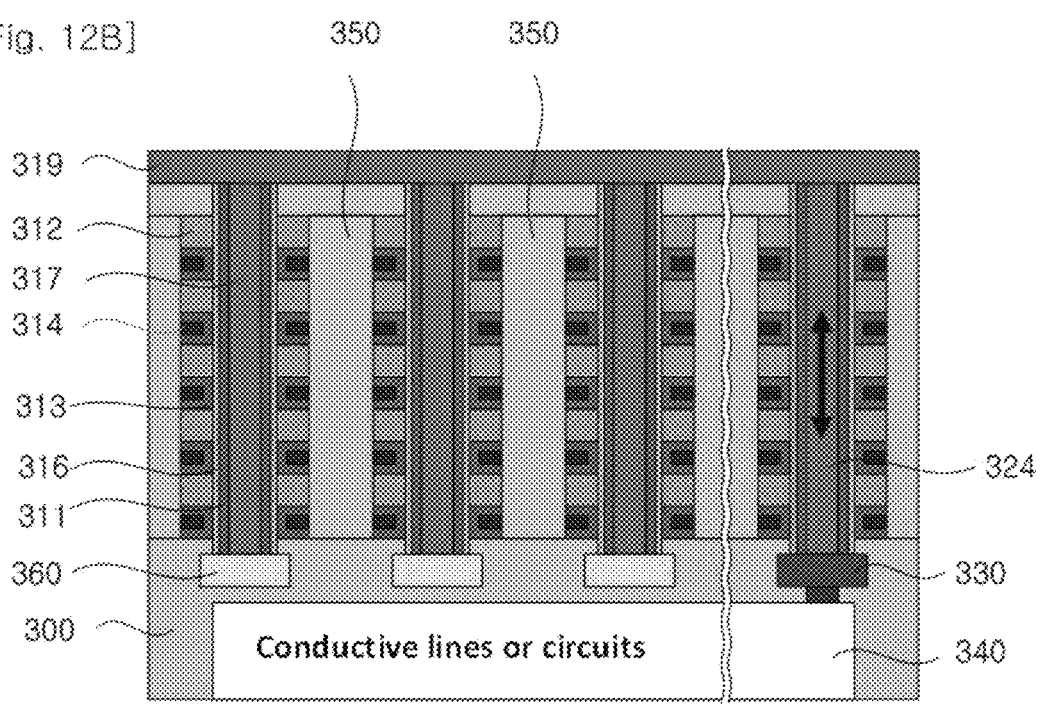
[Fig. 12C]
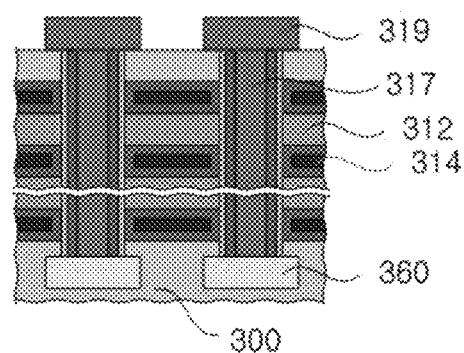

[Fig. 12D]
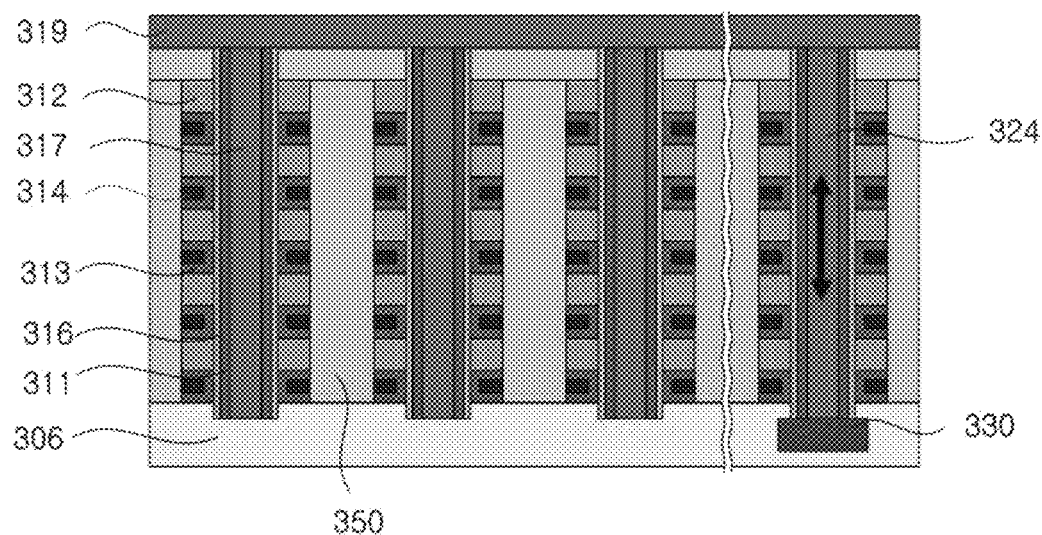
[Fig. 12E]
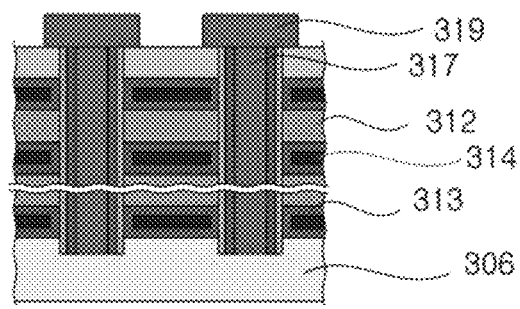

[Fig. 13A]
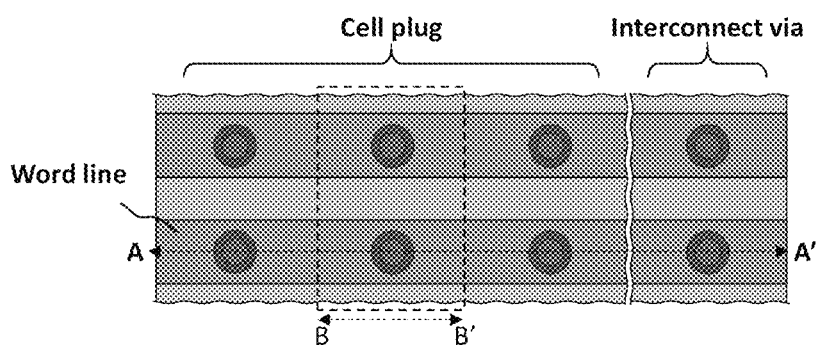
[Fig. 13B]
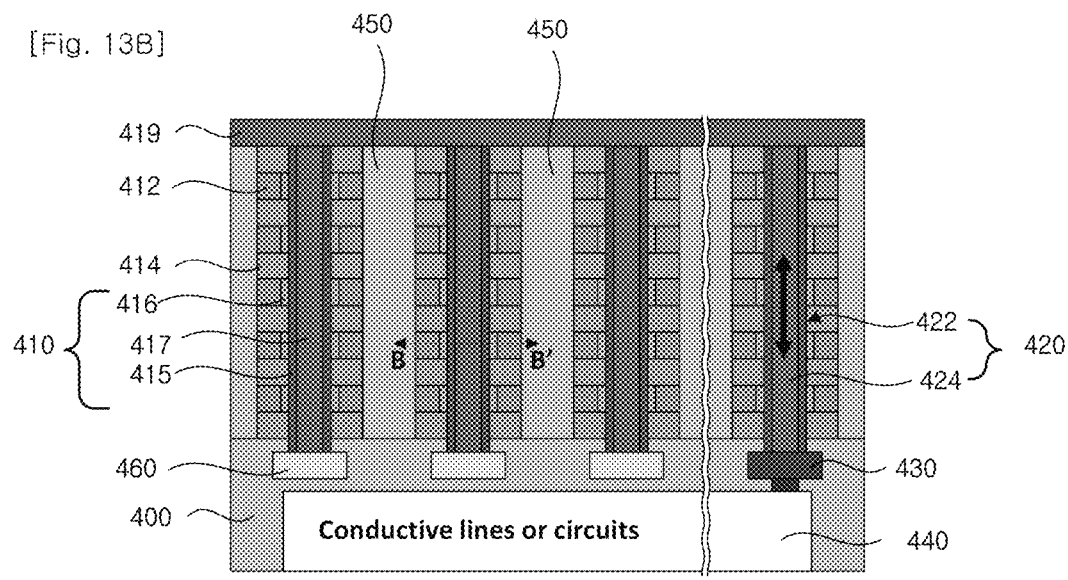
[Fig. 13C]
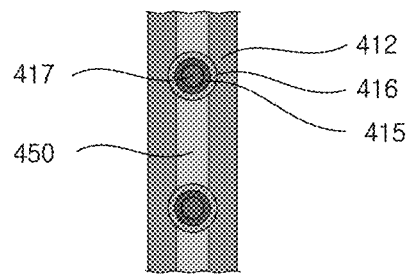

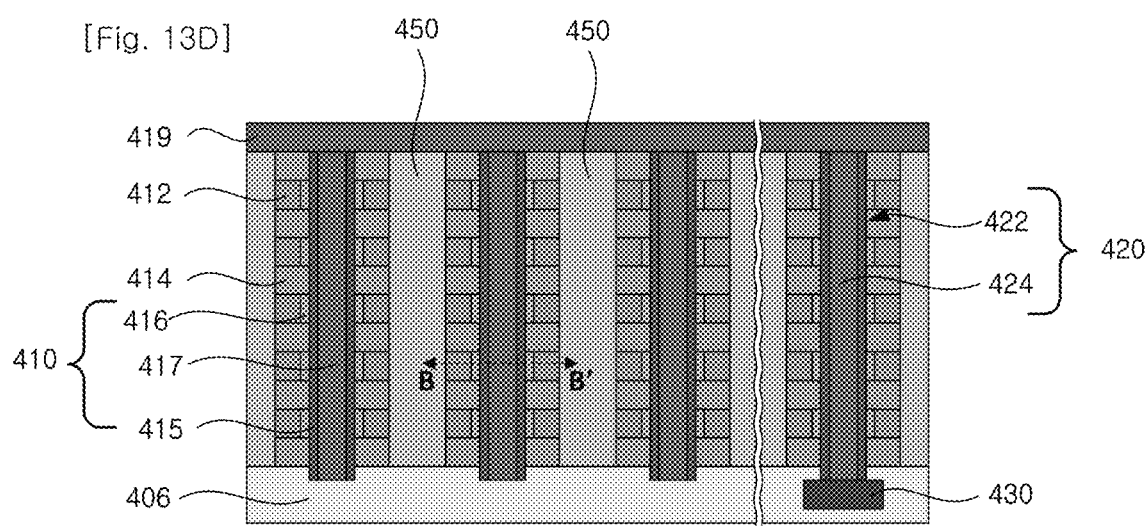
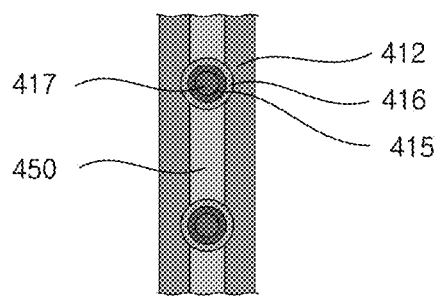

[Fig. 14A]
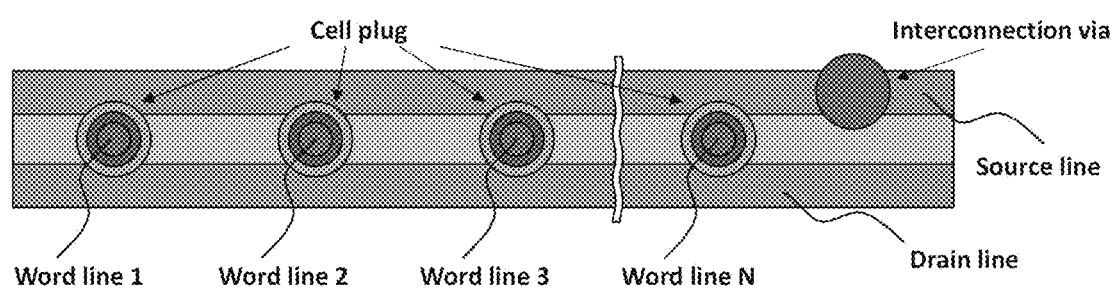
[Fig. 14B]
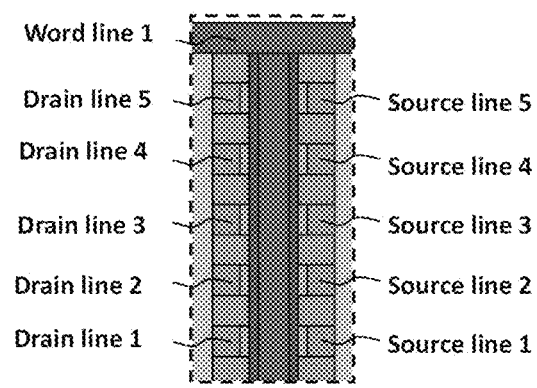

[Fig. 15]
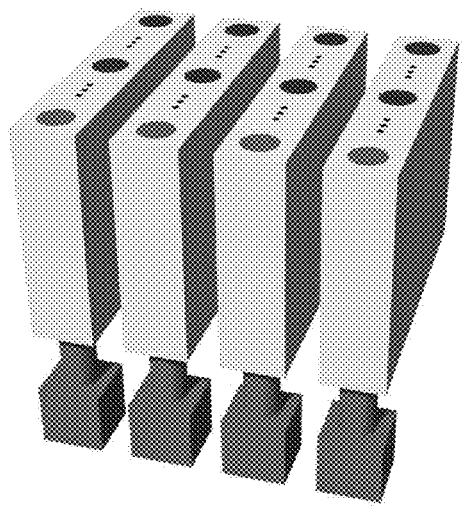

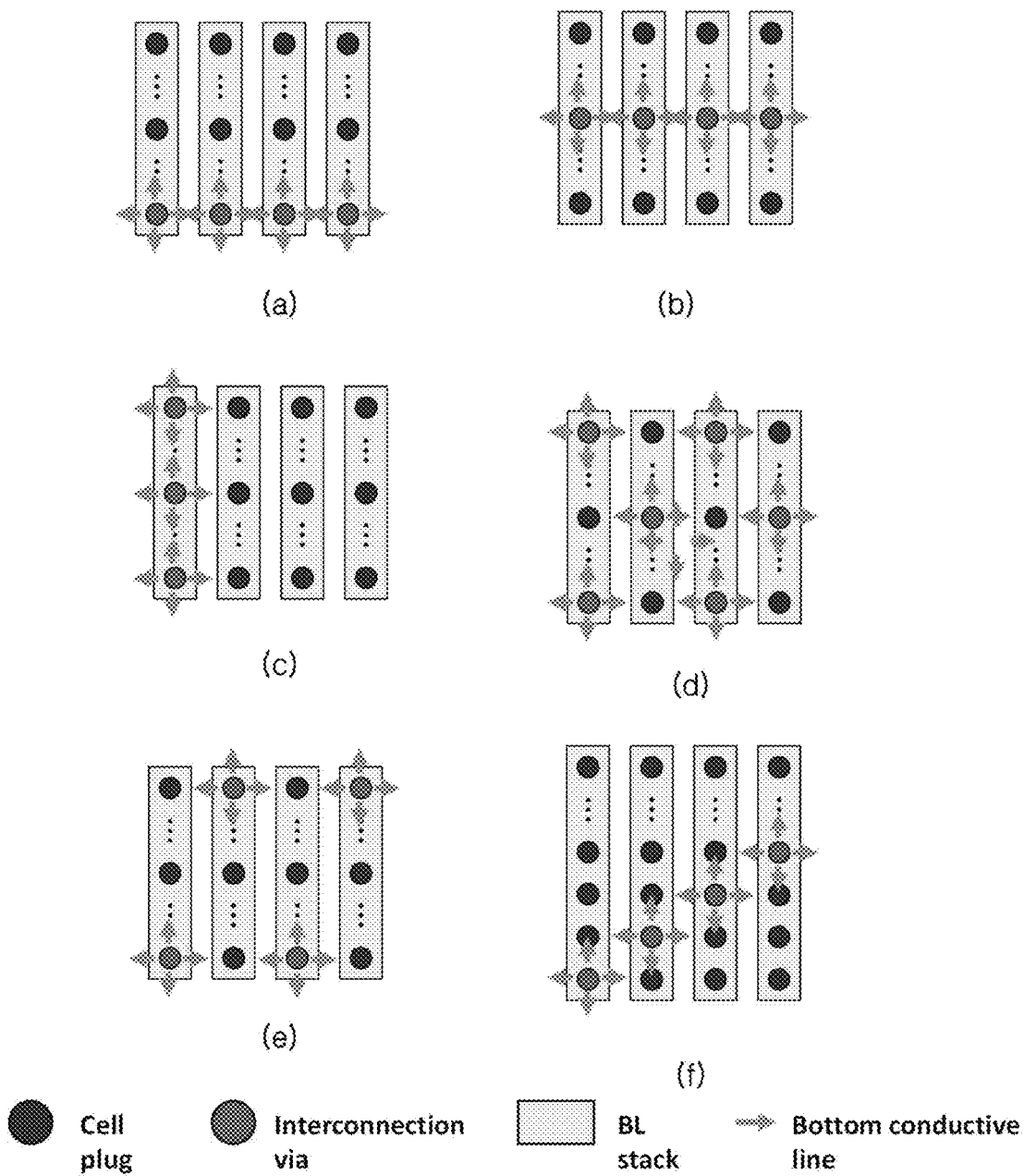
[Fig. 16]

[Fig. 17]
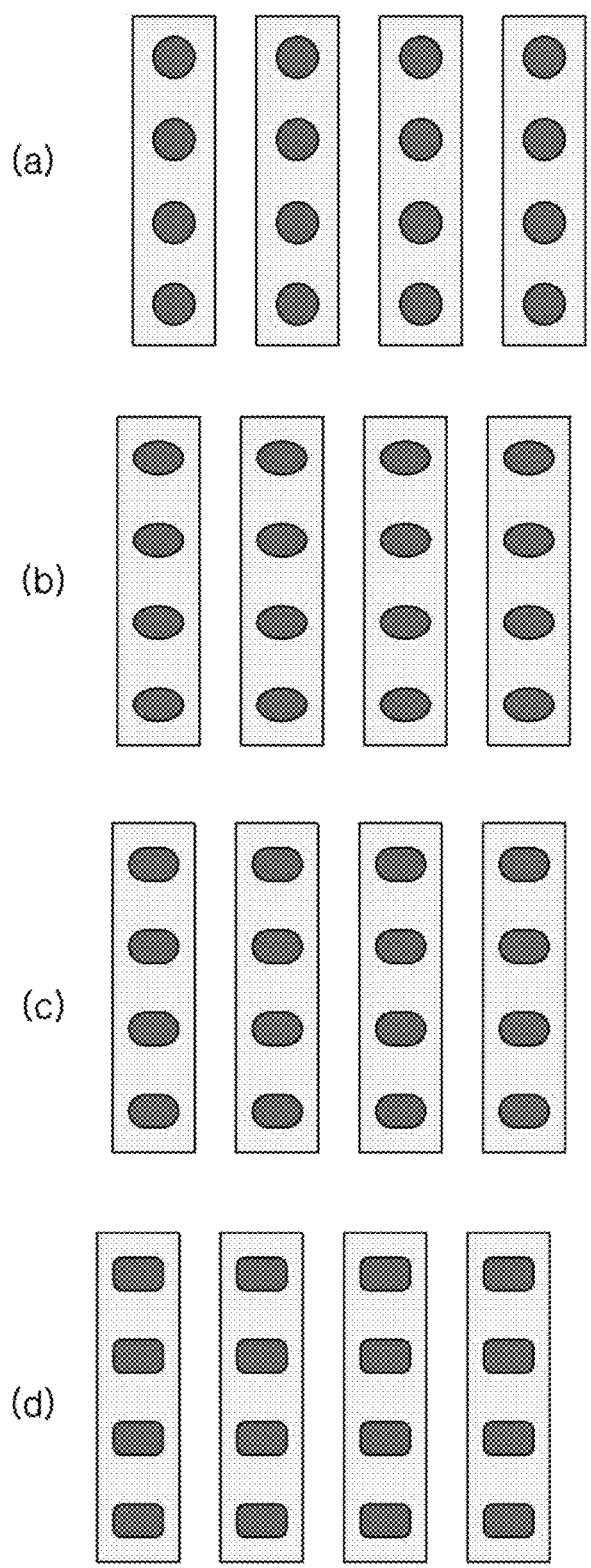

3D STACKED MEMORY AND VERTICAL INTERCONNECT STRUCTURES FOR 3D STACKED MEMORY

BACKGROUND OF THE INVENTION

1. Field of the Invention

The present invention relates to a vertical interconnect structure in a 3D stacked memory device, and more specifically, relates to a 3D stacked memory device where a vertical interconnect structure allowing signals to be transferred between a top electrode and a bottom electrode of a memory stack or peripheral circuits of a substrate arranged in a cell region and a vertical interconnect structure in the 3D stacked memory device. In particular, since the 3D stacked memory device can also include a 3D stacked neuromorphic device for implementing a neural network system, the structure according to the present invention can also be applied to a 3D stacked neuromorphic device.

2. Description of the Related Art

In the existing computing system based on the Von-Neumann structure, data is processed and operation is performed via a bus in the middle of a structure in which memory and processors are separated and a large amount of data is processed. However, since there is a limitation in terms of power consumption and speed, and thus, research into neuromorphic systems that mimic a nervous system of organisms that enable a large amount of data to be processed in parallel has been actively conducted. A neural mimicking artificial intelligence semiconductor device constituting such a neuromorphic system needs to be miniaturized to implement a deep neural network, so that it is very important to improve a degree of integration.

Since a 2D memory device configured with a single layer in a horizontal direction has a limitation in terms of improving the degree of integration, a structure of a 3D stacked memory device that is configured by stacking memory devices in a vertical direction has been actively studied. Currently, 3D stacked memory device technology or artificial intelligence semiconductor device technology has been developed, and research on wiring line connecting multiple synaptic cell elements and peripheral circuits is essential to realize a neuromorphic system using the 3D stacked memory device. More specifically, research on 3D memory stack wiring line, such as wiring line connecting a basic node cell cell to cells and wiring line connecting cells and peripheral circuits needs to be made important.

In the case of a 3D stacked memory device of the related art, a cell structure based on a macaroni body configured with an oxide pillar at the center of a cell plug is applied, and a cell-over-peri or peri-under-cell concept is introduced to configure the peripheral circuit in a region under the cell so as to improve the degree of integration. The peri-under-cell or cell-over-peri denotes a structure or technology that increases the space efficiency by arranging a peripheral circuit (peri) under the cell. However, in the 3D NAND flash technology which is currently in production, there are problems in that process difficulty in configuring wiring lines for the vertical interconnect for use in the neuromorphic and artificial intelligence device-based systems is high, and additional area consumption such as formation of via-holes for wiring lines in a region not overlapping with the cells. In other types of the 3D stacked memory devices, there is a problem in that a process is complicated in configuring a vertical interconnect and the occupation area is large.

In addition, in recent years, a method has been proposed in which, in order to electrically connect a memory cell array of a 3D stacked memory device to a peripheral circuit, a gate electrode is arranged between a memory cell and a peripheral circuit element, and a channel of the memory cell is used as vertical interconnect wiring (Korean Patent Publication No. 10-2019-0026418). In this method, an insulating film stack and a sidewall protective film are additionally arranged around the cell string to be used as the vertical interconnect wiring, and the wiring line is used as a macaroni-shaped polycrystalline silicon or monocrystalline silicon which is a channel of the cell string, and thus, there is a problem in that the resistance to the vertical interconnect greatly increases. Although some channel regions may contain p-type impurities, there is no mention of high concentration doping for interconnect with a low resistance, and it is difficult to be used as interconnect.

SUMMARY OF THE INVENTION

In order to solve the above-described problems, the present invention is to provide a 3D stacked memory device that has a vertical interconnect structure in a cell region to increase a degree of integration and reduce process complexity.

According to the 1st aspect of the present invention, there is provided a 3D stacked memory device having a cell region in which memory stacks are arranged on a substrate, wherein vertical memory stacks and a vertical interconnect structure are provided in the cell region, wherein the vertical interconnect structure includes: a via-hole formed along a vertical direction of the cell region; and a conductive pillar shaped by filling the via-hole with a conductive material, and wherein a lower end of the vertical interconnect structure is electrically connected to a conductive wiring line, a conductive region provided on the substrate, or a specific wiring line region of a circuit portion.

In the 3D stacked memory device according to the above-described aspect of the present invention, by providing a conductive via-hole for vertical interconnect together in a cell stack such as a cell plug of a 3D memory stacked structure, a wiring line structure capable of effectively implementing vertical interconnect is provided.

In the 3D stacked memory device according to the above-described aspect of the present invention, it is preferable that the cell region includes: a stacked structure formed by alternately stacking a gate and an insulating film on the substrate; and a plurality of cell plugs configured to penetrate through the stacked structure in the vertical direction, wherein the cell plug is sequentially provided with a gate insulating film stack and a semiconductor layer for forming a channel from an inner peripheral surface of the cell plug, a center of the cell plug is provided with an oxide pillar made of an insulating material, and the via-hole of the vertical interconnect structure is formed to penetrate through the stacked structure formed on the substrate, and the gate and the insulating film of the stacked structure are alternately stacked and arranged on a side surface of the vertical interconnect structure.

In the 3D stacked memory device according to the above-described aspect of the present invention, it is preferable that the cell region further includes a trench located between the cell plugs and the via-hole and formed to penetrate through the stacked structure along the vertical direction, with an inner portion thereof being filled with an oxide material.

In the 3D stacked memory device according to the above-described aspect of the present invention, it is preferable that the substrate is configured as a semiconductor substrate, or is configured as an insulating material substrate, and the vertical memory stack includes a gate insulating film stack having a stacked structure in which a plurality of layers including a charge storage layer including traps and an insulating film are stacked.

In the 3D stacked memory device according to the above-described aspect of the present invention, it is preferable that the conductive material constituting the conductive pillar is configured with one of an electrically conductive metal, binary and poly-alloy, metal nitride, a doped semiconductor, and a silicide.

In the 3D stacked memory device according to the above-described aspect of the present invention, it is preferable that the vertical interconnect structure further includes an insulating film configured to surround an outer peripheral surface of the conductive pillar and arranged on the inner peripheral surface of the via-hole.

In the 3D stacked memory device according to the above-described aspect of the present invention, it is preferable that the vertical interconnect structure is sequentially provided with a gate insulating film stack, a semiconductor layer for forming a channel, and an insulating film from the inner peripheral surface of the via-hole, and the insulating film is configured to surround an outer peripheral surface of the conductive pillar.

In the 3D stacked memory device according to the above-described aspect of the present invention, it is preferable that the cell region further includes a trench arranged between the cell plugs and the via-hole and formed to penetrate through the stacked structure along the vertical direction, with an inner portion thereof being filled with an oxide material.

In the 3D stacked memory device according to the above-described aspect of the present invention, it is preferable that the vertical memory stack further includes: a stacked structure formed by alternately stacking a gate and a first insulating film on the substrate; and a plurality of cell plugs configured to penetrate through the stacked structure in the vertical direction, the cell plug is sequentially provided with a gate insulating film stack and a semiconductor layer for forming a channel from an inner peripheral surface of the cell plug, a center of the cell plug is provided with an oxide pillar shaped by being filled with an insulating material, a side surface of the vertical interconnect structure is provided with an insulating film stacked structure configured by alternately stacking second and third insulating films having different dielectric constants, the via-hole of the vertical interconnect structure is provided to penetrate through the insulating film stacked structure, a semiconductor layer and a fourth insulating film are sequentially provided from an inner peripheral surface of the via-hole, and the fourth insulating film is configured to surround an outer peripheral surface of the conductive pillar.

In the 3D stacked memory device according to the above-described aspect of the present invention, it is preferable that the vertical memory stack includes a bit cost scalable (BiCS) structure, a pied-shaped BiCS (P-BiCS) structure, a terabit cell array transistor (TCAT) structure, or a stacked memory device array transistor (SMArT) structure.

In the 3D stacked memory device according to the above-described aspect of the present invention, it is preferable that the cell region further includes: a stacked structure formed by alternately stacking a gate and a first insulating film on the substrate; and a plurality of cell plugs formed to penetrate through the stacked structure in the vertical direction, the cell plug is sequentially provided with a gate insulating film stack, a semiconductor layer for forming a channel, and a second insulating film from an inner peripheral surface of the cell plug, a center of the cell plug is further provided with a cell conductive electrode formed in a pillar shape filled with a conductive material, the via-hole of the vertical interconnect structure is formed to penetrate through the stacked structure formed on the substrate, and the gate and the first insulating film are alternately stacked and arranged on a side surface of the vertical interconnect structure, and the vertical interconnect structure includes a fourth insulating film configured to surround an outer peripheral surface of the conductive pillar and arranged on the inner peripheral surface of the via-hole.

In the 3D stacked memory device according to the above-described aspect of the present invention, it is preferable that the cell region includes: a stacked structure formed by alternately stacking a gate and a first insulating film on the substrate; an interlayer insulating film arranged under the substrate; an etching stopper layer arranged in the interlayer insulating film; and a plurality of cell plugs formed to penetrate through the stacked structure down to the etching stopper layer in the vertical direction, the cell plug is sequentially provided with a gate insulating film stack, a semiconductor layer for forming a channel, and an insulating film from an inner peripheral surface of the cell plug, a center of the cell plug is further provided with a cell conductive electrode formed in a pillar shape filled with a conductive material, the via-hole of the vertical interconnect structure is formed to penetrate through the stacked structure formed on the substrate, and a gate and a first insulating film are alternately stacked and arranged on a side surface of the vertical interconnect structure, and the vertical interconnect structure includes a fourth insulating film configured to surround an outer peripheral surface of the conductive pillar and arranged on the inner peripheral surface of the via-hole.

In the 3D stacked memory device according to the above-described aspect of the present invention, it is preferable that the cell region further includes a trench arranged between the cell plugs and the via-hole and formed to penetrate through the stacked structure along the vertical direction, with an inner portion thereof being filled with an oxide material, the vertical interconnect structure is sequentially provided with a gate insulating film stack and a semiconductor layer for forming a channel from an inner peripheral surface of the via-hole, and the semiconductor layer is configured to surround an outer peripheral surface of the insulating film surrounding the outer peripheral surface of the conductive pillar.

In the 3D stacked memory device according to the above-described aspect of the present invention, it is preferable that the cell region includes: a stacked structure formed by alternately stacking an electrode layer and a control gate with a surface thereof surrounded by the gate insulating film stack on the substrate; and a plurality of cell plugs formed to penetrate through the stacked structure in the vertical direction, the cell plug includes a main gate formed in a pillar shape along the vertical direction of the substrate, a gate insulating film stack along an outer peripheral surface of the main gate, and a channel region formed along an outer peripheral surface of the gate insulating film stack, the via-hole of the vertical interconnect structure is formed to penetrate through the stacked structure configured on the substrate, and an electrode layer and a control gate with a surface thereof being surrounded by the gate insulating film stack are alternately stacked and arranged on a side surface of the vertical interconnect structure, and the cell region further includes a trench arranged between the cell plugs and the via-hole and formed to penetrate through the stacked structure along the vertical direction, with an inner portion thereof being filled with an oxide material.

In the 3D stacked memory device according to the above-described aspect of the present invention, it is preferable that the cell region includes: a stacked structure formed by alternately stacking an electrode layer and a control gate with a surface thereof being surrounded by the gate insulating film stack on the substrate; and a plurality of cell plugs formed to penetrate through the stacked structure in the vertical direction, the cell plug includes a word line formed in a pillar shape along the vertical direction of the substrate, a gate insulating film stack formed on an outer peripheral surface of the word line, and a semiconductor layer for forming a channel in a pipe shape formed between the electrode layers along an outer peripheral surface of the gate insulating film stack, and the cell region further includes a trench arranged between the cell plugs and the via-hole and formed to penetrate through the stacked structure along the vertical direction, with an inner portion thereof being filled with an oxide.

The proposed vertical interconnect structure of the 3D memory stack enables effective signal transfer in the upper and lower portions of the memory stack and provides a wiring line that enables signal transfer between cells and circuits in a case where circuits exist in the region under the cells in the 3D stacked structure or in the periphery. This allows a peri-under-cell structure or a cell-over-peri structure to be effectively formed.

In addition, the wiring line for the vertical interconnect is configured so that the weight summation is possible in the 3D memory stacked structure, and thus, it is expected that the present invention can be applied to artificial intelligence semiconductor devices, the degree of integration can be dramatically improved, and the possibility of commercialization will be high in the future.

In addition, according to embodiments, a 3D stacked structure includes a vertical interconnect structure that enables weight summation in a 3D stacked structure, and thus, it is possible to configure a vertical wiring line so that the weight summation is possible in a vertical or horizontal direction for artificial intelligence calculation. According to embodiments, a vertical interconnect wiring line is configured to bundle up vertically stacked electrodes in a 3D stacked structure, and thus, wiring line formation for layer-by-layer contact of the electrode is reduced, so that it is possible to improve the degree of integration.

In addition, according to embodiments, it is possible to obtain an effect of utilizing a vertical interconnect structure to implement a large capacitor required in an artificial intelligence circuit or a system including a neuron circuit by using the specificity of the structure in a 3D stacked structure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A is a plan view illustrating Examples 1 and 2 of a 3D stacked memory device according to a first embodiment of the present invention;

FIG. 1B is a cross-sectional view of Example 1 of the 3D stacked memory device according to the first embodiment taken along line A-A' of FIG. 1A;

FIG. 1C is a cross-sectional view of Example 2 of the 3D stacked memory device according to the first embodiment taken along line A-A' of FIG. 1A;

FIG. 2A is a plan view illustrating Examples 3 and 4 of the 3D stacked memory device according to the first embodiment of the present invention;

FIG. 2B is a cross-sectional view of Example 3 taken along the A-A' of FIG. 2A;

FIG. 2C is a cross-sectional view of Example 4 of the 3D stacked memory device according to the first embodiment of the present invention taken along line A-A' of FIG. 2A;

FIG. 3A is a plan view illustrating Examples 1 and 2 of a 3D stacked memory device according to a second embodiment of the present invention;

FIG. 3B is a cross-sectional view of Example 1 of the 3D stacked memory device according to the second embodiment taken along line A-A' of FIG. 3A;

FIG. 3C is a cross-sectional view of Example 2 of the 3D stacked memory device according to the second embodiment taken along line A-A' of FIG. 3A;

FIG. 4 is a partial cross-sectional view illustrating Example 3 of the 3D stacked memory device according to the second embodiment of the present invention;

FIG. 5 is a partial cross-sectional view illustrating Example 4 of the 3D stacked memory device according to the second embodiment of the present invention;

FIG. 6A is a plan view illustrating Examples 5 and 6 of the 3D stacked memory device according to the second embodiment of the present invention;

FIG. 6B is a view illustrating Example 5 of the 3D stacked memory device according to the second embodiment taken along line A-A' of 6A;

FIG. 6C is a cross-sectional view of Example 6 of the 3D stacked memory device according to the second embodiment taken along line A-A' of FIG. 6A;

FIG. 7A is a plan view illustrating Examples 7 and 8 of the 3D stacked memory device according to the second embodiment of the present invention;

FIG. 7B is a cross-sectional view illustrating Example 7 of the 3D stacked memory device according to the second embodiment taken along line A-A' of FIG. 7A;

FIG. 7C is a cross-sectional view of Example 8 of the 3D stacked memory device according to the second embodiment of the present invention taken along line A-A' of FIG. 7A;

FIG. 8 is a partial cross-sectional view of a cell plug and a vertical interconnect structure for example 9 of a 3D stacked memory device according to the second embodiment of the present invention;

FIG. 9A is a plan view illustrating Example 10 of the 3D stacked memory device according to the second embodiment of the present invention;

FIG. 9B is a cross-sectional view of Example 10 of the 3D stacked memory device according to the second embodiment taken along line A-A' of FIG. 9A;

FIG. 10 is a partial cross-sectional view of Example 11 of the cell plug and the vertical interconnect structure of the 3D stacked memory device according to the second embodiment of the present invention;

FIG. 11 is a partial cross-sectional view of Example 12 of the cell plug and the vertical interconnect structure of the 3D stacked memory device according to the second embodiment of the present invention;

FIG. 12A is a plan view illustrating a 3D stacked memory device according to the third embodiment of the present invention;

FIG. 12B is a cross-sectional view of Example 1 of the 3D stacked memory device according to the third embodiment taken along line A-A' of FIG. 12A;

FIG. 12C is a cross-sectional view of Example 1 of the 3D stacked memory device according to the third embodiment taken along line B-B' of FIG. 12A

FIG. 12D is a cross-sectional view of Example 2 of the 3D stacked memory device according to the third embodiment of the present invention taken along line A-A' of FIG. 12A;

FIG. 12E is a cross sectional view of Example 2 of the 3D stacked memory device according to the third embodiment taken along line B-B' of FIG. 12A;

FIG. 13A is a plan view illustrating a 3D stacked memory device according to the fourth embodiment of the present invention;

FIG. 13B is a cross-sectional view of Example 1 of the 3D stacked memory device according to the fourth embodiment taken along line A-A' of FIG. 13A;

FIG. 13C is a cross-sectional view of Example 1 of the 3D stacked memory device according to the fourth embodiment taken along line B-B' of FIG. 13A;

FIG. 13D is a cross-sectional view of Example 2 of the 3D stacked memory device according to the fourth embodiment taken along line A-A' of FIG. 13A;

FIG. 13E is a cross-sectional view of Example 2 of the 3D stacked memory device according to the fourth embodiment taken along line B-B' of FIG. 13A;

FIG. 14A is a plan view illustrating Example 3 of the 3D stacked memory device according to the fourth embodiment of the present invention;

FIG. 14B is a partial cross-sectional view of Example 3 of the 3D stacked memory device according to the fourth embodiment;

FIGS. 15 and 16 are perspective and plan views illustrating arrangements of via-holes for vertical interconnect and cell plugs in a cell stack according to embodiments of the present invention; and FIG. 17 is a plan view illustrating a shape of a via-hole for vertical interconnect and a cell plug in a cell stack according to embodiments of the present invention.

DETAILED DESCRIPTION OF THE PREFERRED EMBODIMENTS

A 3D stacked memory device according to the present invention relates to a 3D stacked memory device having a cell region in which memory stacks are arranged on a substrate and a circuit region in which circuits are arranged, vertical memory stacks and vertical interconnect structures are arranged in the cell region, the vertical interconnect structure is configured with vertical wiring plugs made of a conductive material filled in the inside of the via-holes formed along a vertical direction of the cell region. Therefore, the 3D stacked memory device according to the present invention has the vertical interconnect structure configured with the vertical wiring plug made of a conductive material in the cell region, so that the manufacturing process is facilitated, and vertical interconnect between the top electrodes of the stacked memory devices and the bottom electrodes or the peripheral circuit of the substrate is enabled.

Hereinafter, preferred embodiments of the present invention will be described in detail with reference to the accompanying drawings.

First Embodiment

Hereinafter, Examples 1 and 2 of a 3D stacked memory device according to a first embodiment of the present invention will be described in detail with reference to FIGS. 1A to 1C.

FIG. 1A is a plan view illustrating Examples 1 and 2 of a 3D stacked memory device according to a first embodiment of the present invention. FIG. 1B is a cross-sectional view of Example 1 of the 3D stacked memory device according to the first embodiment taken along line A-A' of FIG. 1A. FIG. 1C is a cross-sectional view of Example 2 of the 3D stacked memory device according to the first embodiment taken along line A-A' of FIG. 1A. Example 1 according to the present embodiment illustrated in FIG. 1B is an example for illustrating a conceptual diagram of the present invention.

Referring to FIGS. 1A to 1C, Example 1 of the 3D stacked memory device according to the first embodiment of the present invention is a 3D stacked memory device configured to include a cell region in which memory stacks are arranged on a substrate and vertical memory stacks configured with a cell plug 110 and a vertical interconnect structure (interconnect 120) in the cell region. The non-volatile memory device according to the first embodiment of the present invention is formed in a cell plug region, and the vertical interconnect structure is formed through a via-hole.

The 3D stacked memory device according to the first embodiment has a 3D memory structure in which a gate is arranged on the side surface of the cell plug and an insulating layer made of a dielectric material and the gate are repeated on the substrate, and a gate insulating film provided in the cell plug is configured with at least one charge storage layer and a plurality of insulating layers. The channel can be made of polycrystalline silicon or monocrystalline silicon.

The substrate may be configured as a semiconductor substrate 106 as illustrated in FIG. 1C and may include an n$^+$ doped region 107 locally within the substrate 106. The substrate may include silicon (Si), germanium (Ge), silicon-germanium (SiGe), and the silicon may include monocrystalline silicon or polycrystalline silicon.

As illustrated in FIG. 1B, the memory stack and the vertical interconnect structure according to the present invention may be provided on the substrate and may have a peri-under-cell or cell-over-peri structure. The conductive line or circuit 140 formed on the substrate is provided, and the interlayer insulating film 102 is provided thereon, so that the conductive line or circuit can be insulated from the memory stack. The interlayer insulating film may include, for example, a silicon oxide film.

In the region of the interlayer insulating film 102 formed under the insulating layer 104, a bottom electrode or a wiring line 130 configured with a conductive material or a conductive region is formed at the bottom of the vertical interconnect structure, so that vertical interconnect is enabled through etching. The bottom electrode or the wiring line 130 may be connected to a conductive line or circuit 140 formed on the substrate.

The cell region includes a stacked structure configured by alternately stacking the gate 112 and the insulating film 114 on the substrate 106 or on the insulating layer 104 and a plurality of the cell plugs (CPs) 110 configured to penetrate through the stacked structure in the vertical direction. The insulating film 114 may include a silicon oxide film.

The cell plug 110 may include a channel 116 and a gate insulating film stack 115 arranged between the channel 116 and the gate 112. The channel 116 may be made of polycrystalline silicon or monocrystalline silicon, and if necessary, the channel may not be doped or may be doped with P-type impurities. The channel may be configured in a hollow pipe shape or a macaroni shape in which the inside may be filled with an oxide pillar 117 or may be configured in a pillar shape in which the inside is not empty. The gate insulating film stack 115 may be configured with at least one charge storage layer and a plurality of the insulating films. The gate insulating film stack may be formed of, for example, a stacking structure of a blocking insulating film, a charge storage layer, or a tunneling insulating film. The blocking insulating film may include a metal oxide or silicon oxide, the charge storage layer may include silicon nitride, and the tunneling insulating film may include silicon oxide.

As illustrated in FIG. 1C, an $n^+$ or $p^+$ doped region 107 may be further provided on the substrate 106 under the cell plug. Although not illustrated, an $n^+$ or $p^+$ doped region is provided in units of the entire cell block on the substrate or the first semiconductor layer under the region where one cell block is formed, so that the $n^+$ or $p^+$ doped region may be used as a source line (SL).

The vertical interconnect structure 120 may be provided with a via-hole (VH) 122 formed to pass through the cell region in the vertical direction and a vertical wiring plug 124 where the via-hole is filled with a first conductive material to form a conductive pillar. The vertical interconnect structure may be configured to interconnect the top electrode (top electrode) of the vertical memory stack and the conductive region 130 of the substrate along the vertical direction or may be connected only to the top electrode or only to the conductive region of the substrate. The first conductive material constituting the vertical wiring plug may be made of one of an electrically conductive metal, binary and polyalloy, metal nitride, a doped semiconductor (including a monocrystal semiconductor, a polycrystal semiconductor, and an amorphous semiconductor), and a silicide and may be made of a combination thereof. The metal may include Al, Cu, W, Mo, Ti, Co, Ni, Cr, Mn, Au, Ag, Pt, Ta, V, and Pd, and a binary alloy and a multi-element alloy alloys may be an alloy configured with a metal selected from at least two or more metals described above. The silicide may be configured as a silicide material of a metal selected from the metals described above or a combination thereof. The metal nitride may be configured as TiN, CrN, TaN, WN, or the like. The doped semiconductor is a highly-doped n-type ($n^+$) or p-type ($p^+$) semiconductor, may be highly-doped Si (including single crystal Si, polycrystal Si, and amorphous Si), Ge (including single crystal Ge, polycrystal Ge, and amorphous Ge), and SiGe (including single crystal SiGe, polycrystal SiGe, and amorphous SiGe), and is preferably a conductive material with low resistance.

The via-hole 122 of the vertical interconnect structure 120 is etched and formed to penetrate through the stacked structure formed on the substrate 104, 106, so that the gate 112 and the insulating layer 114 are alternately stacked and arranged.

As illustrated in FIG. 1B, it is preferable that the lower end portion of the vertical interconnect structure is electrically connected to the wiring line 130 provided in the interlayer insulating film or the conductive line or circuit 140 configured on the substrate. The vertical interconnect structure according to the present embodiment does not include a gate insulating film stack and a channel, and includes a vertical wiring plug formed by being filled with a first conductive material including at least one conductive material inside the via-hole. The vertical interconnect structure can be electrically connected to the conductive line and circuit 140 at the bottom along the vertical wiring plug through the bottom electrode or the wiring line 130 formed in the region of the interlayer insulating film 102 across the insulating layer 104. The wiring line may be configured with a second conductive material, and the second conductive material may include a first conductive material.

According to the above-described vertical interconnect structure, the via-hole can be formed in a stacked structure such as a cell plug rather than in an external region of a cell, and thus, a top electrode and bottom circuits can be electrically connected to each other. A vertical interconnect structure may be used so that circuits and semiconductor memory cells existing in the bottom region or the peripheral region of the 3D stacked memory device can exchange signals.

it is possible to electrically connect to the gates of all layers through the vertical interconnect structure according to the first embodiment of the present invention having the above-described configuration, and it is possible to easily apply a voltage in common. In addition, in the 3D stacked memory device according to the present embodiment, a voltage can be applied from the bottom electrode or the top electrode to the gate through the vertical interconnect structure, and it is possible to effectively reduce the slimming region that is required to form the a via connected to the gate of each layer in a structure of the related art.

In addition, through the vertical interconnect structure formed in the cell region according to the present invention, the top electrode and the bottom circuits are connected, and thus, the peri-under-cell or cell-over-peri technology is efficiently enabled without using a space of the external region of the cell, so that high space efficiency can be provided, and Example 1 can be used as a vertical interconnect technology for 3D neuromorphic hardware-based systems.

Referring to FIG. 1C, in Example 2 of the 3D stacked memory device according to the first embodiment of the present invention, a substrate 106 may be provided at the bottom of the cell region, a substrate under the cell plug may be configured with an $n^+$ or $p^+$ doped region 107, and a conductive region 108 may be formed in the substrate below a lower end of the vertical interconnect structure. The vertical interconnect structure may be electrically connected to the top electrode by being electrically connected to the conductive region 108 and may also be connected to a peripheral circuit through the conductive region. The conductive region 108 at the bottom of the vertical interconnect structure may be formed through ion implantation after via-hole formation.

Hereinafter, Examples 3 and 4 of the 3D stacked memory device according to the first embodiment of the present invention will be described in detail.

FIG. 2A is a plan view illustrating Examples 3 and 4 of the 3D stacked memory device according to the first embodiment of the present invention. FIG. 2B is a cross-sectional view of Example 3 of the 3D stacked memory device according to the first embodiment of the present invention taken along the A-A' of FIG. 2A. On the other hand, FIG. 2C is a cross-sectional view of Example 4 of the 3D stacked memory device according to the first embodiment of the present invention taken along line A-A' of FIG. 2A.

Referring to FIGS. 2A to 2C, Examples 3 and 4 of the 3D stacked memory device according to the first embodiment of the present invention are 3D stacked memory devices including a cell region in which memory stacks are arranged on the substrates 104 and 106 and a circuit region in which circuits are arranged and including a vertical memory stack 110, a vertical interconnect structure ((interconnect; 120), and a trench 150 between cell plugs extending in the Y and Z directions in the cell region. The 3D stacked memory device according to the present embodiment has a structure similar to that of the 3D stacked memory device of Examples 1 and 2 of the first embodiment except for the trench 150 between the cell plugs extending in the Y and Z directions and the lower shape of the cell plug. In particular, Examples 3 and 4 are different from each other in terms of the substrate region under the cell plug. Therefore, redundant descriptions will be omitted or simply mentioned.

That is, Examples 3 and 4 of the 3D stacked memory device according to the first embodiment of the present invention further include a trench 150 arranged between the cell plugs 110 in the cell region. The trench 150 is arranged between cell plugs and is formed to penetrate through the stacked structure in the vertical direction, and the inside is filled with an oxide.

Referring to FIGS. 2A to 2C, the cell plug 110 and the vertical interconnect structure 120 may be formed on the substrate 106 or the first semiconductor layer 104. The first semiconductor layer 104 may be made of monocrystalline silicon or polycrystalline silicon. The conductive line or circuit 140 may be provided under the substrate 106 or the first semiconductor layer 104, and the interlayer insulating film 102 may be provided between the circuit and the first semiconductor layer. The interlayer insulating film may be configured as a silicon oxide film.

The via-hole 122 for the cell plug 110 and the vertical interconnect structure 120 may be provided on the substrate 106 or the first semiconductor layer 104. The region under the trench 150 in the substrate or the first semiconductor layer may be configured as a first doped region 152 and may be used as a source line. For example, the substrate 106 and the first semiconductor layer 104 may be configured with a P-type semiconductor, and the first doped region may be configured as an $N^+$ region. The source lines can be grouped in common to form a common source line. The via-hole may be configured in the same manner as the via-hole in the vertical interconnect structure according to the first embodiment. The via-hole may include at least one conductive material, and the vertical wiring plug in pillar shape filled with a first conductive material may be provided inside the via-hole. The via-hole may be connected to the wiring line formed in the interlayer insulating film across the first semiconductor layer or may be connected to the wiring line provided on the substrate. An oxide film such as a silicon oxide film may be provided between the vertical wiring plug and the substrate or the first semiconductor layer. The first conductive material and wiring line may be configured in the same manner as those of the first embodiment.

According to the above-described embodiment, via-holes for vertical interconnects are formed together in a stack in which a cell plug is formed to electrically connect the top electrode and the bottom circuit. Signals can be transmitted between the top electrode and the bottom electrode or circuit through the via-hole and thus, the cells in the stacked structure can exchange signals with the peripheral circuit.

In the present embodiment, the vertical wiring plug and the gate may be provided by being electrically connected. A voltage can be applied to the lower or upper portion of the vertical wiring plug through the vertical wiring plug electrically connected to the gate of the cell stack.

In addition, by the above-described vertical interconnect structure, electrical signals can be simultaneously applied to a plurality of the gates of the cell stack in which via-holes are formed. The circuit or conductive line may be provided under the vertical wiring plug.

Hereinafter, Examples 5 and 6 of the 3D stacked memory device according to the first embodiment of the present invention will be described in detail.

In Example 5 of the 3D stacked memory device according to the first embodiment of the present invention, the stacked structure of the cell region is configured by alternately stacking two insulating films having different dielectric constants around the via-hole. For example, a structure in which an oxide film (first insulating film) and a nitride film (second insulating film) are alternately repeated and stacked may be provided. In addition, the vertical interconnect structure includes a vertical wiring plug in which a conductive pillar in a via-hole is formed.

Example 6 of the 3D stacked memory device according to the first embodiment of the present invention has a stacked structure of the cell which is configured by alternately stacking the word lines of which surfaces are surrounded by the gate insulating film stack and the insulating films of.

The stacked structure of the cell region of Examples 5 and 6 of the 3D stacked memory device according to the above-described first embodiment is similar to that of other Examples of the first embodiment except for other structures, and thus redundant description is omitted.

Second Embodiment

Hereinafter, Examples of a 3D stacked memory device according to a second embodiment of the present invention will be described in detail.

Hereinafter, Example 1 of the 3D stacked memory device according to the second embodiment of the present invention will be described in detail with reference to FIGS. 3A to 3B. The second embodiment of the present invention is different from the first embodiment in terms of the via-hole structure for the vertical interconnect structure, and all other configurations are similar. Therefore, in the present embodiment, descriptions of structures the same as or similar to those of the first embodiment are omitted, and only structures different from the first embodiment are described.

FIG. 3A is a plan view illustrating the 3D stacked memory device according to the second embodiment of the present invention. FIG. 3B is a cross-sectional view of Example 1 of the 3D stacked memory device according to the second embodiment taken along line A-A' of FIG. 3A. FIG. 3C is a cross-sectional view of Example 2 of the 3D stacked memory device according to the second embodiment taken along line A-A' in FIG. 3A. Example 1 according to the present embodiment illustrated in FIG. 3B is an example for illustrating a conceptual diagram of the present invention.

Referring to FIGS. 3A to 3C, Examples 1 and 2 of the 3D stacked memory device according to the second embodiment of the present invention is a 3D stacked memory device configured to include a cell region in which memory stacks are arranged and a circuit region in which circuits are arranged on an insulating layer 204 and a substrate 206 and vertical memory stacks and a vertical interconnect structure (interconnect 220) in the cell region. The non-volatile memory device according to the second embodiment of the present invention is formed in a cell plug 210 region, and the vertical interconnect structure 220 is formed through a via-hole 222.

Since the cell region of the 3D stacked memory device according to the second embodiment is the same as that of the first embodiment, redundant description is omitted.

The cell plug 210 may include a channel 216 and a gate insulating film stack 215 arranged between the channel and a gate 212. The channel 216 may be made of polycrystalline silicon or monocrystalline silicon, and if necessary, the channel may not be doped or may be doped with P-type impurities. The channel may be formed in a hollow pipe shape or a macaroni shape, and the inside may be filled with an oxide pillar 217 or a pillar shape in which the inside is not empty.

The via-hole 222 of the vertical interconnect structure 220 of the 3D stacked memory device according to the second embodiment is formed by being etched to penetrate through the stacked structure formed on the insulating layer 204 or the substrate 206, so that the gates 212 and the insulating layers 214 are alternately stacked and arranged on the side surfaces of the vertical interconnect structure.

The via-hole 222 for the vertical interconnect structure 220 may include the channel 216 and the channel insulating film stack 215 between the channel and the gate 212. The channel and the gate insulating film stack 215 of the via-hole may be formed in the same manner as the channel and the gate insulating film stack of the cell plug. The via-hole may include at least one conductive material therein. For example, a vertical wiring plug 224 in a conductive pillar shape made of a first conductive material may be formed inside the via-hole, and an insulating film 218 such as a silicon oxide film may be formed between the channel 216 and the vertical wiring plug 224. The via-hole 222 can be electrically connected to the conductive line and circuit 240 at the bottom along the vertical wiring plug 224 through the wiring line 230 formed in an interlayer insulating film 202 across the insulating layer 204. The first conductive material may be made of one of an electrically conductive metal, binary and polyalloy, metal nitride, a doped semiconductor (including a monocrystal semiconductor, a polycrystal semiconductor, and an amorphous semiconductor), and a silicide. The doped semiconductor is a highly-doped n-type ($n^+$) or p-type ($p^+$) semiconductor, may be highly-doped Si (including single crystal Si, polycrystal Si, and amorphous Si), Ge (including single crystal Ge, polycrystal Ge, and amorphous Ge), and SiGe (including single crystal SiGe, polycrystal SiGe, and amorphous SiGe), and is preferably a conductive material with low resistance. The wiring line 230 may be made of a second conductive material, and the second conductive material may include a first conductive material.

By the above-described vertical interconnect structure, via-holes can be formed in a stack such as a cell plug instead of being formed in a cell external region to electrically connect a difference between a top electrode and a lower wiring line or circuit. The doped semiconductor is a highly-doped n-type ($n^+$) or p-type ($p^+$) semiconductor, may be highly-doped Si (including single crystal Si, polycrystal Si, and amorphous Si), Ge (including single crystal Ge, polycrystal Ge, and amorphous Ge), and SiGe (including single crystal SiGe, polycrystal SiGe, and amorphous SiGe), and is preferably a conductive material with low resistance.

In addition, in the above-described vertical interconnect structure, a channel in a via-hole can be grounded to block crosstalk between a vertical interconnect structure and a peripheral cell plug and a vertical interconnect structure, and coupling between a wiring line for the vertical interconnect and peripheral gates can be prevented.

Referring to FIG. 3C, in Example 2 of the 3D stacked memory device according to the second embodiment of the present invention, a substrate 206 can be provided at the bottom of the cell region, the substrate under the cell plug can be configured with an $n^+$ or $p^+$ doped regions 207, and a conductive region 208 can be configured on the substrate under the lower end of the vertical interconnect structure. The vertical interconnect structure may be electrically connected to the top electrode by being electrically connected to the conductive region 208 and may also be connected to the peripheral circuit through the conductive region. The conductive region 208 at the bottom of the vertical interconnect structure may be formed through ion implantation after via-hole formation.

The illustrated 3D stacked memory device is exemplary, and the present invention is not limited thereto. The 3D stacked memory device described above may have a Bit Cost Scalable technology (BiCS) structure, a Pipe-shaped BiCS (P-BiCS) structure, or a stacked memory device array transistor (SMArT) structure and can be provided in the same stack as the above-described vertical interconnect structure. A BiCS structure (H. Tanaka et al., Bit Cost Scalable Technology with Punch and Plug Process for Ultra High Density Flash Memory, in Technical Digest of Symposium on VLSI Technology, pp. 14-15, 2007) and a P-BiCS structure (R. Katsumata et al., Pipe-shaped BiCS Flash Memory with 16 Stacked Layers and Multi-Level-Cell Operation for Ultra High Density Storage Devices, in Technical Digest of Symposium on VLSI Technology, pp. 136-134, 2009) was published by Toshiba, and a SMArT structure (E.-S. Choi and S.-K. Park, Device considerations for high density and highly reliable 3D NAND flash cell in near future, in Technical Digest of International Electron Devices Meeting, pp. 211-214, 2012) was published by SK Hynix.

Hereinafter, Example 3 of the 3D stacked memory device according to the second embodiment of the present invention will be described in detail. FIG. 4 is a partial cross-sectional view illustrating Example 3 of the 3D stacked memory device according to the second embodiment of the present invention.

Referring to FIG. 4, in Example 3 of the 3D stacked memory device according to the second embodiment of the present invention, two insulating films having different dielectric constants are configured to be alternately stacked in addition to the stacked structure around a via-hole. For example, a structure in which an oxide film (first insulating film) and a nitride film (second insulating film) are alternately repeated and stacked may be provided.

The vertical interconnect structure has a first electrode formed by filling a via-hole with a conductive material, the first electrode is made of a conductive material including a metal, a highly doped n-type ($n^+$) or p-type ($p^+$) polysilicon, a silicide, or the like and serves as the vertical interconnect. A second semiconductor region may be provided between the plurality of insulating films around the via-holes and the first electrode. A second semiconductor region may be provided in the same manner as the channel of the cell plug. A third insulating film may be provided between the second semiconductor region and the first electrode. The third insulating film may include a silicon oxide film, a metal oxide film, a nitride film, and the like. By grounding the second semiconductor region in the via-hole in the vertical interconnect structure, cross talk between the vertical interconnect structure and the peripheral cell plug and the vertical interconnect structure can be blocked, and coupling between the wiring line for the vertical interconnect and the peripheral gates can be prevented.

In addition, a cylindrical capacitor can be provided with the first electrode and the second semiconductor region in the via-hole as two nodes, and a capacitor having a large capacitance can be effectively provided.

Hereinafter, Example 4 of the 3D stacked memory device according to the second embodiment of the present invention will be described in detail.

FIG. 5 is a partial cross-sectional view illustrating Example 4 of the 3D stacked memory device according to the second embodiment of the present invention.

Referring to FIG. 5, in Example 4 of the 3D stacked memory device according to the second embodiment of the present invention, the stacked structure of the cell region may be configured by alternately stacking the word line of which the surface is surrounded by the gate insulating film stack and the insulating film. Therefore, the word lines of which the surface is surrounded by the gate insulating film stack and insulating films alternately stacked and arranged on the side of the via-hole of the vertical interconnect structure.

Hereinafter, Examples 5 and 6 of the 3D stacked memory device according to the second embodiment of the present invention will be described in detail with reference to FIGS. 6A to 6B.

FIG. 6A is a plan view illustrating Examples 5 and 6 of the 3D stacked memory device according to the second embodiment of the present invention. FIG. 6B is a cross-sectional view of Example 5 of the 3D stacked memory device according to the second embodiment taken along line A-A' direction of FIG. 6A. FIG. 6C is a cross-sectional view of Example 6 of the 3D stacked memory device according to the second embodiment taken along line A-A' direction of FIG. 6A.

Example 6 according to the present embodiment illustrated in FIG. 6B is an example for illustrating a conceptual diagram of the present invention.

Referring to FIGS. 6A to 6C, Examples 5 and 6 of the 3D stacked memory device according to the second embodiment of the present invention are configured to include the conductive electrode 219 configured in a pillar shape in which the cell plug 210 is filled with a conductive material. The conductive electrode 219 inside the cell plug may be made of the same material as the vertical wiring plug 224 formed in the via-hole 222 of the vertical interconnect structure 220. An oxide film 217 in the form of an empty tube may be provided between the channel 216 inside the cell plug and the conductive electrode 219, and the oxide film 217 allows the conductive electrode 219 and the channel 216 to be electrically isolated from each other.

With the above-described structure, a voltage can be applied from the top electrode to the conductive electrode of the cell plug that can be connected. For example, since the same pass voltage can be applied to cell transistors in a string of the corresponding cell plug the above-described structure is useful for reading and writing a cell.

Referring to FIG. 6C, the structure of the substrate of Example 6 of the 3D stacked memory device according to the second embodiment of the present invention is different from that of Example 5 in that the $n^+$ or $p^+$ high concentration doped region 207 is provided in the substrate 206 region at the bottom of the cell plug, and the conductive region 208 is provided in the substrate 206 region at the bottom of the vertical interconnect structure 220.

Hereinafter, Examples 7 and 8 of the 3D stacked memory device according to the second embodiment of the present invention will be described in detail with reference to FIGS. 7A to 7C.

FIG. 7A is a plan view illustrating Examples 7 and 8 of the 3D stacked memory device according to the second embodiment of the present invention. FIG. 7B is a cross-sectional view illustrating Example 7 of the 3D stacked memory device according to the second embodiment taken along line A-A' of FIG. 7A. FIG. 7C is a cross-sectional view of Example 8 of the 3D stacked memory device according to the second embodiment of the present invention taken along line A-A' of FIG. 7A.

Referring to FIGS. 7A to 7C, Examples 7 and 8 of the 3D stacked memory device according to the second embodiment of the present invention further include a trench 250 arranged between the cell plugs extending in the Y and Z directions in the cell region. Examples 7 and 8 have a structure similar to the 3D stacked memory device according to Examples 1 and 2 of the second embodiment except for the lower shape of the trench T and the cell plug. Therefore, redundant descriptions will be omitted or simply mentioned.

Referring to FIGS. 7A to 7C, the cell plug 210 and the vertical interconnect structure 220 may be formed on the substrate 206 or the first semiconductor layer 204. The first semiconductor layer 204 may be made of monocrystalline silicon or polycrystalline silicon. A conductive line or circuit 240 may be provided under the substrate 206 or the first semiconductor layer 204, and the interlayer insulating film 202 may be provided between the circuit and the first semiconductor layer. The interlayer insulating film may be configured as a silicon oxide film.

Referring to FIG. 7C, the structure of the substrate of Example 8 of the 3D stacked memory device according to the second embodiment of the present invention is different from that of the Example 7 in that the substrate 206 is provided at the bottom of the cell region, an $n^+$ or $p^+$ high concentration doped region 252 is provided in the substrate region at the bottom of the trench 250 region, and the conductive region 230 is provided in a substrate region at the bottom of the vertical interconnect structure 220

The via-hole 222 for the cell plug 210 and the vertical interconnect structure 220 may be provided on the substrate 206 or the first semiconductor layer 204. The trench 250 between the cell plugs may be configured with an oxide. The region under the trench in the substrate or the first semiconductor layer may be configured as the first doped region 252 and may be used as a source line. For example, the substrate and the first semiconductor layer may be formed of a P-type semiconductor, and the first doped region may be formed of an $N^+$ region. The source lines can be grouped in common to form a common source line. The via-hole may be configured in the same manner as the via-hole in the vertical interconnect structure according to Examples 1 and 2 of the second embodiment. The via-hole may include at least one conductive material, and the vertical wiring plug 224 in a pillar shape filled with a first conductive material may be provided inside the via-hole. The via-hole may be connected to the wiring line 230 formed in the interlayer insulating film 202 across the first semiconductor 204 layer or may be connected to the wiring line 230 provided on the substrate. An oxide film 202 such as a silicon oxide film may be provided between the vertical wiring plug 224 and the substrate 206 or the first semiconductor layer 204. The first conductive material and wiring line may be configured in the same manner as those of Examples 1 and 2 of the second embodiment.

According to the above-described embodiment, via-holes for vertical interconnects are formed together in a stack in which cell plugs are formed to s electrically connect the top electrode and the bottom circuit. Signals can be transmitted between the top electrode and the bottom electrode or circuit through the via-hole and thus, the cells in the stacked structure can exchange signals with the peripheral circuit.

In addition, in the above-described vertical interconnect structure, a channel in a via-hole can be grounded to block cross talk between a vertical interconnect structure and a peripheral cell plug and a vertical interconnect structure, and coupling between a wiring line for the vertical interconnect and the peripheral gates can be prevented.

The illustrated 3D stacked memory device is exemplary, and the present invention is not limited thereto. The above-described 3D stacked memory device may have a TCAT (Terabit Cell Array Transistor) structure, and may be provided in the same stack as the above-described vertical interconnect structure. The TCAT structure (J. Jang et al., Vertical cell array using TCAT (Terabit Cell Array Transistor) technology for ultra high density NAND flash memory, in Technical Digest of Symposium on VLSI Technology, pp. 192-193, 2009) was published by Samsung.

FIG. 8 is a partial cross-sectional view of the cell plug 210 and the vertical interconnect structure 220 in Example 9 of the 3D stacked memory device according to the second embodiment of the present invention. Referring to FIG. 8, in Example 9 of the 3D stacked memory device according to the second embodiment of the present invention, a conductive electrode 219 is provided inside the cell plug, and a vertical wiring plug 224 is provided inside the via-hole of the vertical interconnect structure, and the vertical wiring plug is connected to the conductive region 230 in the substrate. The conductive electrode may be configured in a pillar shape and may be made of the same material as the vertical wiring plug of the via-hole. A tube type of an oxide film may be provided between the channel and the conductive electrode, and the oxide film electrically separates the conductive electrode and the channel. The via-hole for the vertical interconnect structure 220 may include the channel 216 and the gate insulating film stack 215 between the channel and the gate 212. The channel and the gate insulating film stack 215 of the via-hole may be formed in the same manner as the channel and the gate insulating film stack of the cell plug.

With the above-described structure, a voltage can be applied from the top electrode to the conductive electrode of the cell plug that can be connected. For example, since the same pass voltage can be applied to cell transistors in a string of the corresponding cell plug the above-described structure is useful for reading and writing a cell.

Hereinafter, Example 10 of a 3D stacked memory device according to the second embodiment of the present invention will be described in detail with reference to FIGS. 9A to 9B.

FIG. 9A is a plan view illustrating Example 10 of the 3D stacked memory device according to the second embodiment of the present invention. FIG. 9B is a cross-sectional view of Example 10 of the 3D stacked memory device according to the second embodiment taken along line A-A' of FIG. 9A. Referring to FIGS. 9A to 9B, the structure of Example 10 of the 3D stacked memory device according to the second embodiment of the present invention is similar to that of the memory device and the vertical interconnect structure of the second embodiment except for the bottom shape of the cell plug. Therefore, redundant descriptions will be omitted or simply mentioned.

Referring to FIGS. 9A and 9B, an etching stopper layer 260 may be provided under the cell plug in a region inside the interlayer insulating film under the first semiconductor layer, and the etching stopper layer may be configured with a material (for example, silicon) having a different etching rate from an oxide including silicon oxide and a nitride including silicon nitride. The via-hole 222 may include at least one conductive material and may be electrically connected to the wiring line 230 in the lower interlayer insulating film 202 across the first semiconductor layer 204. The via-hole may have the same shape as the via-hole in the second embodiment. At least one insulating film (for example, a silicon oxide film) may be formed between the conductive electrode in the cell plug and the vertical wiring plug in the via-hole and the first semiconductor layer.

Due to the above-described vertical interconnect structure, by forming the via-hole in a stack such as a cell plug without forming an external region of the cell, the top electrode and the bottom circuits can be electrically connected to each other. In addition, the vertical interconnect structure can be used so that circuits and semiconductor memory cells existing in the bottom region or the peripheral region of the 3D stacked memory device can exchange signals.

With the above-described structure, a voltage can be applied from the top electrode to the conductive electrode 219 of the cell plug 210 that can be connected. For example, since the same pass voltage can be applied to cell transistors in a string of the corresponding cell plug the above-described structure is useful for reading and writing a cell.

FIG. 10 is a partial cross-sectional view of the cell plug 210 and the vertical interconnect structure 220 in Example 11 of the 3D stacked memory device according to the second embodiment of the present invention. Referring to FIG. 10, Example 11 of the 3D stacked memory device according to the second embodiment of the present invention has a structure similar to Example 10 the 3D stacked memory device according to the second embodiment except that the lower portion of the cell plug 210 and the vertical interconnect structure 220 is replaced by a substrate 206. Therefore, redundant descriptions will be omitted or simply mentioned.

The cell plug 210 may be electrically connected through the first doped region 262 provided in the substrate and the conductive electrode 219 in the cell plug. The first doped region 262 may be configured as, for example, an $N^+$ region. The region under the trench 250 may not be configured as an $N^+$ region, and the first doped region 262 may be provided as a source line. The source line can be connected to the top electrode through the conductive electrode 219 in the cell plug, and signals can be transmitted from the top electrode to the source line.

By forming the vertical interconnect structure 220 in a stack such as a cell plug without forming an external region of the cell, t the top electrode and the bottom circuits can be electrically connected to each other. In addition, the vertical interconnect structure may be used so that circuits and semiconductor memory cells existing in the bottom region or the peripheral region of the 3D stacked memory device can exchange signals.

11 is a partial cross-sectional view of a cell plug and a vertical interconnect structure of Example 12 of the 3D stacked memory device according to the second embodiment of the present invention. Referring to FIG. 11, Example 12 of the 3D stacked memory device according to the second embodiment of the present invention may include a cell region and a peripheral circuit region. The insulating layer between the ground select line of the cell string and the substrate may be formed to be thick to provide a region for constructing circuit transistors in the peripheral circuit region arranged on the substrate. Although not illustrated, the peripheral circuit region may include contact plugs and wiring lines. One N-type circuit transistor exemplarily illustrated in the peripheral circuit region includes a gate, a gate insulating film stack, and an N⁺ region, a P⁻ well, and a P⁺ contact region in the substrate on both sides of the gate provided as a source/drain (contact region). A shallow trench isolation (STI) trench configured with silicon oxide may be provided on the N-type transistor.

Third Embodiment

Hereinafter, Examples of the 3D stacked memory device according to a third embodiment of the present invention will be described in detail.

Hereinafter, Examples 1 and 2 of the 3D stacked memory device according to the third embodiment of the present invention will be described in detail with reference to FIGS. 12A to 12E. In the present embodiment, descriptions of structures the same as or similar to those of Examples 1 and 2 are omitted, and only structures different from the first embodiment or the second embodiment are described.

FIG. 12A is a plan view illustrating the 3D stacked memory device according to the third embodiment of the present invention. FIG. 12B is a cross-sectional view of Example 1 of the 3D stacked memory device according to the third embodiment taken along line A-A' of FIG. 12A. FIG. 12C is a cross-sectional view of Example 1 of the 3D stacked memory device according to the third embodiment taken along line B-B' of FIG. 12A. Referring to FIGS. 12A to 12C, Example 1 of the 3D stacked memory device according to the third embodiment of the present invention includes a substrate 300, a stacked structure formed in a cell region on the substrate, cell plugs 310 formed along the vertical direction of the stacked structure, trenches 350, and vertical interconnect structure 320 formed in the cell region. The cell plug includes a main gate 317 having a pillar shape in the vertical direction on the substrate, a channel 316 formed around the main gate, and a main gate insulating film stack 311 formed between the channel 316 and the main gate 317, and the stacked structures are arranged around the channel 316. The stacked structure includes a plurality of electrode layers 312, a plurality of control gates 314, and a plurality of control gate insulating films 313 surrounding the control gates and being formed between the control gates and the channel. The control gates 314 and the electrode layers 312 are alternately stacked and provided.

The cell plug 310 and the via-hole for the vertical interconnect structure 320 may be provided on the substrate 300. The cell plug and the via-hole for the vertical interconnect structure may be configured with a vertical main gate 317, a main gate insulating film stack 311, and a channel 316. The gate insulating film stack and the channel may be made of the same materials as the gate insulating film stack and channel of the first and second embodiments of the present invention, respectively. A trench 350 made of an oxide is provided between the cell plug and between the cell plug and the via-hole.

The substrate 300 may be used as a silicon oxide film substrate or a semiconductor substrate. In a case where the substrate is a silicon oxide film substrate, a conductive line or a peripheral circuit may be provided under the substrate, and an interlayer insulating film may be provided between the circuit and the cell stack. The interlayer insulating film may be made of the same material as the substrate. In the region within the interlayer insulating film, an etching stopper layer 360 may be provided under the cell plug and may be configured in the same manner as the etching stopper layer according to the second embodiment of the present invention. The via-hole may be electrically connected to wiring lines 330 and 340 in a lower interlayer insulating film through a main gate serving as an internal vertical wiring plug 324.

At the top of the cell stack, the main gates of the cell plug can be connected on the same word line. Although not illustrated, the main gate of the conductive via-hole for the vertical interconnect structure can be separated on the same word line as the main gate of the cell plug.

The illustrated memory device and vertical interconnect structure can be applied to a vertical neuromorphic device of U.S. Pat. No. 10,103,162. A voltage may be applied to a word line in a circuit under the cell stack or in a top electrode through the conductive via-hole of the vertical interconnect structure. In a case where a signal is applied to the word line in this structure, a weight summation calculation may be performed by summing the currents corresponding to the word line signals in the electrode layer of the bit line or the source line perpendicular to the word line. Although not illustrated, the current signals combined to the peripheral circuit under the cell stack can be transferred by connecting the electrode layer and the conductive via-hole for the vertical interconnect.

FIG. 12D is a cross-sectional view of Example 2 of the 3D stacked memory device according to the third embodiment taken along line A-A' of FIG. 12A. FIG. 12E is a cross-sectional view of Example 2 of the 3D stacked memory device according to the third embodiment taken along line B-B' of FIG. 12A. Referring to FIGS. 12D to 12E, in Example 2 of the 3D stacked memory device according to the third embodiment of the present invention, the portion under the cell region is configured with a semiconductor substrate 306, the inside of the substrate located at the bottom of the vertical interconnect structure include a second conductive region 330 made of a second conductive material, and the vertical interconnect structure 320 is electrically connected to the second conductive region 330. The second conductive region 330 may be connected to a peripheral circuit or a controller.

Fourth Embodiment

Hereinafter, Examples of the 3D stacked memory device according to the fourth embodiment of the present invention will be described in detail.

Hereinafter, Examples 1 and 2 of the 3D stacked memory device according to the fourth embodiment of the present invention will be described in detail with reference to FIGS. 13A to 13E. In the present embodiment, descriptions of structures the same as or similar to those of the first and second embodiments are omitted, and only structures different from those of the first embodiment or the second embodiment are described.

FIG. 13A is a plan view illustrating the 3D stacked memory device according to the fourth embodiment of the present invention. FIG. 13B is a cross-sectional view of Example 1 of the 3D stacked memory device according to the fourth embodiment of the present invention taken along line A-A' of FIG. 13A. FIG. 13C is a cross-sectional view of Example 1 of the 3D stacked memory device according to the fourth embodiment of the present invention taken along the B-B' direction of FIG. 13A. Referring to FIGS. 13A to 13C, Example 1 of the 3D stacked memory device according to the fourth embodiment of the present invention includes a word line 417 having a pillar shape in a vertical direction on the substrate a gate insulating film stack 415 formed around the word line 417, a plurality of electrode layers 412 and insulating layers 414 alternately stacked around the via-hole 422 for the cell plug 410 and the vertical interconnect structure 420, and a tube-shaped channel 416 formed between the electrode layer 412 and the gate insulating film stack 415. The gate insulating film stack 415 and the channel 416 may be configured with the same materials as the gate insulating film stack and the channel of the third embodiment of the present invention, respectively. A trench 450 made of oxide is provided between the cell plugs and between the cell plug and the via-hole. The lower portion of the cell stack is similar to that of the third embodiment of the present invention in terms of the interlayer insulating film 400, the etching stopper layer 460 at a lower portion of the cell plug, and the conductive region 430 and the wiring line 440 formed in the interlayer insulating film 400 under the via-hole.

The word lines 417 of the cell plug at the top of the cell stack may be connected on the same upper word line 419. Although not illustrated, the vertical wiring plug 424 of the conductive via-hole of the vertical interconnect structure 420 may be separated on the word line 417 and the upper word line 419 of the cell plug and may be connected to the upper word line 419 and other top electrodes in a distinguishable manner.

FIG. 13D is a cross-sectional view of Example 2 of the 3D stacked memory device according to the fourth embodiment taken along line A-A' of FIG. 13A. FIG. 13E is a cross-sectional view of Example 2 of the 3D stacked memory device according to the fourth embodiment taken along line B-B' of FIG. 13A. Referring to FIGS. 13D to 13E, in Example 2 of the 3D stacked memory device according to the fourth embodiment of the present invention, the lower portion of the cell region is configured with a substrate 406, the inside of the substrate located at the lower end of the vertical interconnect structure 420 is provided with a second conductive region 430 made of a second conductive material, and the vertical interconnect structure 420 is electrically connected to the second conductive region 430. The second conductive region may be connected to a peripheral circuit or a controller.

FIG. 14A is a plan view illustrating Example 3 of the 3D stacked memory device according to the fourth embodiment of the present invention. FIG. 14B is a partial cross-sectional view of Example 3 of the 3D stacked memory device according to the fourth embodiment. Referring to FIGS. 14A and 14B, Example 3 of the 3D stacked memory device according to the fourth embodiment of the present invention, a vertical interconnect structure can be configured by penetrating one of the electrode layers vertically in a pillar shape and being filled with a conductive material. The conductive material may include a metal, a highly doped n-type ($n^+$) or p-type ($p^+$) polysilicon, or a silicide. For example, N word lines and M bit lines (M, N are integers of five or more) may be provided, and a conductive via-hole may be provided in the source line.

With the illustrated vertical interconnect structure, signal can be transmitted from the top to the bottom or from the bottom to the top through the conductive via-hole. In addition, a common source contact plug can be configured through the vertical interconnect structure without individually configuring the contact plugs for the respective stacked source lines, and an area of the region for forming electrode contact plugs can be effectively reduced.

In a case where the signals are applied to the N word lines by the above-described semiconductor memory device and the vertical interconnect structure, the currents according to the word line signals are summed along the word line and the perpendicular bit line, so that the weight summation calculation can be performed in the horizontal direction. In addition, in a case where a signal is applied to the M bit lines, the currents flowing in the bit lines of each layer through the via-hole for the vertical interconnect serving as a common source contact plug may be summed to perform weight summation calculation in the vertical direction, and the summed signal can be transferred to the lower peripheral circuit or wiring line. Although not illustrated, the summed signal can be transferred to the upper portion by connecting to the top electrode terminal without connecting the conductive via-hole to the lower peripheral circuit or wiring line.

FIGS. 15 and 16 are perspective and plan views illustrating an arrangement shape of via-holes for cell plug and vertical interconnect in a cell stack according to embodiments of the present invention.

Referring to FIGS. 15 and 16, at least one or more via-holes for the vertical interconnect in the bit line direction in a cell stack array may be provided. In the cell stack array, the via-hole may include a shape aligned at the end of each bit line, a shape aligned at the center of each bit line, a shape aligned at one bit line, a shape aligned alternately with adjacent cell plugs, a shape aligned at the end of each bit line and alternately aligned in the word line direction perpendicular to the bit line, and a shape aligned diagonally in the bit line and word line.

FIG. 17 is a plan view illustrating a shape of the via-hole for the cell plug and the vertical interconnect in a cell stack according to embodiments of the present invention. Referring to FIG. 17, the shape of the via-hole for the cell plug and the vertical interconnect may include a circle, an ellipse, a shape with rounded ends (a distorted circle), and a shape with rounded corners.

While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

What is claimed is:

1. A 3D stacked memory device having a cell region in which memory stacks are arranged on a substrate,
    wherein vertical memory stacks and a vertical interconnect structure are provided in the cell region,
    wherein the vertical interconnect structure includes:
    a via-hole formed along a vertical direction of the cell region;
    a conductive pillar shaped by filling the via-hole with a conductive material; and
    a gate insulating film stack, a semiconductor layer for forming a channel, and an insulating film which are sequentially arranged between an inner peripheral surface of the via-hole and the conductive pillar,
    wherein the insulating film is configured to surround an outer peripheral surface of the conductive pillar, and
    wherein a lower end of the vertical interconnect structure is electrically connected to a conductive wiring line, a conductive region provided on the substrate, or a specific wiring line region of a circuit portion.

2. The 3D stacked memory device according to claim 1, wherein the cell region includes:
a stacked structure formed by alternately stacking a gate and an insulating film on the substrate; and
a plurality of cell plugs configured to penetrate through the stacked structure in the vertical direction,
wherein each of the cell plugs is sequentially provided with a gate insulating film stack and a semiconductor layer for forming a channel from an inner peripheral surface of the cell plug,
wherein a center of the cell plug is provided with an oxide pillar made of an insulating material, and
wherein the via-hole of the vertical interconnect structure is formed to penetrate through the stacked structure formed on the substrate, and the gate and the insulating film of the stacked structure are alternately stacked and arranged on a side surface of the vertical interconnect structure.

3. The 3D stacked memory device according to claim 2, wherein the cell region further includes a trench located between the cell plugs and the via-hole and formed to penetrate through the stacked structure along the vertical direction, with an inner portion thereof being filled with an oxide material.

4. The 3D stacked memory device according to claim 1, wherein the substrate is configured as a semiconductor substrate, or is configured as an insulating material substrate, and
wherein each of the vertical memory stacks includes a gate insulating film stack having a stacked structure in which a plurality of layers including a charge storage layer including traps and an insulating film are stacked.

5. The 3D stacked memory device according to claim 1, wherein the conductive material constituting the conductive pillar is configured with one of an electrically conductive metal, binary and polyalloy, metal nitride, a doped semiconductor, and a silicide.

6. The 3D stacked memory device according to claim 1, wherein each of the vertical memory stacks includes a bit cost scalable (BiCS) structure, a pied-shaped BiCS (P-BiCS) structure, a terabit cell array transistor (TCAT) structure, or a stacked memory device array transistor (SMArT) structure.

7. The 3D stacked memory device according to claim 1, wherein the cell region includes:
a stacked structure formed by alternately stacking a gate and a first insulating film on the substrate; and
a plurality of cell plugs formed to penetrate through the stacked structure in the vertical direction,
wherein each of the cell plugs is sequentially provided with a gate insulating film stack, a semiconductor layer for forming a channel, and a second insulating film from an inner peripheral surface of the cell plug,
wherein a center of the cell plug is further provided with a cell conductive electrode formed in a pillar shape filled with a conductive material, and
wherein the via-hole of the vertical interconnect structure is formed to penetrate through the stacked structure formed on the substrate, and the gate and the first insulating film are alternately stacked and arranged on a side surface of the vertical interconnect structure.

8. The 3D stacked memory device according to claim 7, wherein the cell region further includes a trench arranged between the cell plugs and the via-hole and formed to penetrate through the stacked structure along the vertical direction, with an inner portion thereof being filled with an oxide.

9. The 3D stacked memory device according to claim 1, wherein the cell region includes:
a stacked structure formed by alternately stacking a gate and a first insulating film on the substrate;
an interlayer insulating film arranged under the substrate;
an etching stopper layer arranged in the interlayer insulating film; and
a plurality of cell plugs formed to penetrate through the stacked structure down to the etching stopper layer in the vertical direction,
wherein each of the cell plugs is sequentially provided with a gate insulating film stack, a semiconductor layer for forming a channel, and an insulating film from an inner peripheral surface of the cell plug,
wherein a center of the cell plug is further provided with a cell conductive electrode formed in a pillar shape filled with a conductive material, and
wherein the via-hole of the vertical interconnect structure is formed to penetrate through the stacked structure formed on the substrate, and a gate and a first insulating film are alternately stacked and arranged on a side surface of the vertical interconnect structure.

10. The 3D stacked memory device according to claim 9, wherein the cell region further includes a trench arranged between the cell plugs and the via-hole and formed to penetrate through the stacked structure along the vertical direction, with an inner portion thereof being filled with an oxide material.

11. A 3D stacked memory device having a cell region in which memory stacks are arranged on a substrate,
wherein vertical memory stacks, a trench and a vertical interconnect structure are provided in the cell region,
wherein the vertical interconnect structure includes:
a via-hole formed along a vertical direction of the cell region; and
a conductive pillar shaped by filling the via-hole with a conductive material,
wherein the cell region includes:
a stacked structure formed by alternately stacking an electrode layer and a
control gate with a surface thereof surrounded by a first gate insulating film stack on the substrate and arranged on a side surface of the vertical interconnect structure; and
a plurality of cell plugs formed to penetrate through the stacked structure in the vertical direction,
wherein each of the cell plugs includes a main gate formed in a pillar shape along the vertical direction of the substrate, a second gate insulating film stack along an outer peripheral surface of the main gate, and a channel region formed along an outer peripheral surface of the second gate insulating film stack,
wherein the via-hole of the vertical interconnect structure is formed to penetrate through the stacked structure configured on the substrate,
wherein the trench is arranged between the cell plugs and the via-hole and formed to penetrate through the stacked structure along the vertical direction, with an inner portion thereof being filled with an oxide material and
wherein a lower end of the vertical interconnect structure is electrically connected to a conductive wiring line, a conductive region provided on the substrate, or a specific wiring line region of a circuit portion.

12. The 3D stacked memory device according to claim 11, wherein the vertical interconnect structure is further sequentially provided with a channel and a gate insulating film stack from an inner peripheral surface of the via-hole, and
wherein the gate insulating film stack inside the via-hole is configured to surround an outer peripheral surface of the conductive pillar, and the conductive pillar of the via-hole is configured with a vertical wiring plug.

13. A 3D stacked memory device having a cell region in which memory stacks are arranged on a substrate,
wherein vertical memory stacks, a trench and a vertical interconnect structure are provided in the cell region,
wherein the vertical interconnect structure includes:
a via-hole formed along a vertical direction of the cell region; and
a conductive pillar shaped by filling the via-hole with a conductive material,
wherein the cell region includes:
a stacked structure formed by alternately stacking an electrode layer and a control gate with a surface thereof surrounded by the gate insulating film stack on the substrate; and
a plurality of cell plugs formed to penetrate through the stacked structure in the vertical direction,
wherein each of the cell plugs includes a word line formed in a pillar shape along the vertical direction of the substrate, a gate insulating film stack formed on an outer peripheral surface of the word line, and a semiconductor layer for forming a channel in a pipe shape formed between the electrode layers along an outer peripheral surface of the gate insulating film stack,
wherein the trench is arranged between the cell plugs and the via-hole and formed to penetrate through the stacked structure along the vertical direction, with an inner portion thereof being filled with an oxide, and
wherein a lower end of the vertical interconnect structure is electrically connected to a conductive wiring line, a conductive region provided on the substrate, or a specific wiring line region of a circuit portion.

14. The 3D stacked memory device according to claim 13, wherein the via-hole of the vertical interconnect structure is formed to penetrate through the stacked structure configured on the substrate, and an insulating layer and an electrode layer are alternately stacked and arranged on a side surface of the vertical interconnect structure with a semiconductor layer for forming a channel in a pipe shape between the electrode layers along an outer peripheral surface of the via-hole,
wherein the vertical interconnect structure further includes a gate insulating film stack along an inner peripheral surface of the via-hole, and
wherein the gate insulating film stack is configured to surround an outer peripheral surface of the conductive pillar, and the conductive pillar of the via-hole is configured with a vertical wiring plug.

15. The 3D stacked memory device according to claim 13, wherein the via-hole of the vertical interconnect structure is formed to penetrate through one of the electrode layers of the stacked structure configured on the substrate in the vertical direction, and the conductive pillar of the via-hole is configured with a vertical wiring plug.

* * * * *